United States Patent
Youn et al.

(10) Patent No.: US 9,602,057 B1
(45) Date of Patent: Mar. 21, 2017

(54) APPARATUS FOR AND METHOD OF A SUPPLY MODULATOR FOR A POWER AMPLIFIER

(71) Applicant: Samsung Electronics Co., Ltd., Gyeonggi-do (KR)

(72) Inventors: Yong Sik Youn, Cupertino, CA (US); Seung Chul Lee, Gyeonggi-do (KR); Ji Seon Paek, Gyeonggi-do (KR); Thomas Byunghak Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/954,561

(22) Filed: Nov. 30, 2015

Related U.S. Application Data

(60) Provisional application No. 62/220,463, filed on Sep. 18, 2015, provisional application No. 62/242,939, filed on Oct. 16, 2015.

(51) Int. Cl.
*H03F 1/30* (2006.01)
*H03F 1/02* (2006.01)
*H03F 3/193* (2006.01)
*H03F 3/21* (2006.01)

(52) U.S. Cl.
CPC ........... *H03F 1/0211* (2013.01); *H03F 3/193* (2013.01); *H03F 3/21* (2013.01); *H03F 2200/102* (2013.01); *H03F 2200/451* (2013.01)

(58) Field of Classification Search
CPC ....................................................... H03F 1/30
USPC ......................................... 330/297, 296, 285
See application file for complete search history.

(56) References Cited

U.S. PATENT DOCUMENTS

| | | | |
|---|---|---|---|
| 6,889,034 B1 | 5/2005 | Dent | |
| 7,061,313 B2 | 6/2006 | Kimball et al. | |
| 7,268,525 B2 * | 9/2007 | Ishii | H02M 3/1582 323/282 |
| 7,679,433 B1 | 3/2010 | Li | |
| 8,571,498 B2 | 10/2013 | Khlat | |
| 8,705,254 B2 | 4/2014 | Tan et al. | |
| (Continued) | | | |

FOREIGN PATENT DOCUMENTS

| | | |
|---|---|---|
| KR | 10-1467231 | 8/2014 |
| WO | WO 2014/118344 | 11/2014 |

*Primary Examiner* — Henry Choe
(74) *Attorney, Agent, or Firm* — The Farrell Law Firm, P.C.

(57) ABSTRACT

An apparatus for and method of a supply modulator (SM) for a power amplifier (PA) is provided. The apparatus includes a buck-boost converter, including a supply input connected to a battery voltage (Vbat), and an output; a switch and capacitors module, including a first input connected to the output of the buck-boost converter, and a second input; a buck (dual) converter, including a supply input connected to Vbat, an input connected to the output of the buck-boost converter, and an output connected to the second input of the switch and capacitors module; a linear amplifier (LA), including a supply input connected to the output of the buck-boost converter, an input, and an output connected to the second input of the switch and capacitors module; and the PA, including a supply input connected to the output of the buck (dual converter, an input for receiving a radio frequency (RF) signal, and an output for outputting an RF signal.

28 Claims, 19 Drawing Sheets

(56) References Cited

U.S. PATENT DOCUMENTS

| | | | |
|---|---|---|---|
| 8,896,279 B2 * | 11/2014 | Wu | H02M 3/1584 |
| | | | 323/259 |
| 8,981,847 B2 * | 3/2015 | Balteanu | H03F 1/02 |
| | | | 330/136 |
| 2014/0218109 A1 | 8/2014 | Wimpenny | |
| 2014/0232458 A1 | 8/2014 | Arno et al. | |
| 2014/0240040 A1 | 8/2014 | Langer | |
| 2014/0266462 A1 | 9/2014 | Schirmann et al. | |
| 2014/0273897 A1 | 9/2014 | Drogi et al. | |
| 2015/0002235 A1 * | 1/2015 | Mathe | H03F 3/19 |
| | | | 330/297 |
| 2016/0065139 A1 * | 3/2016 | Lee | H03F 1/0227 |
| | | | 330/278 |

* cited by examiner

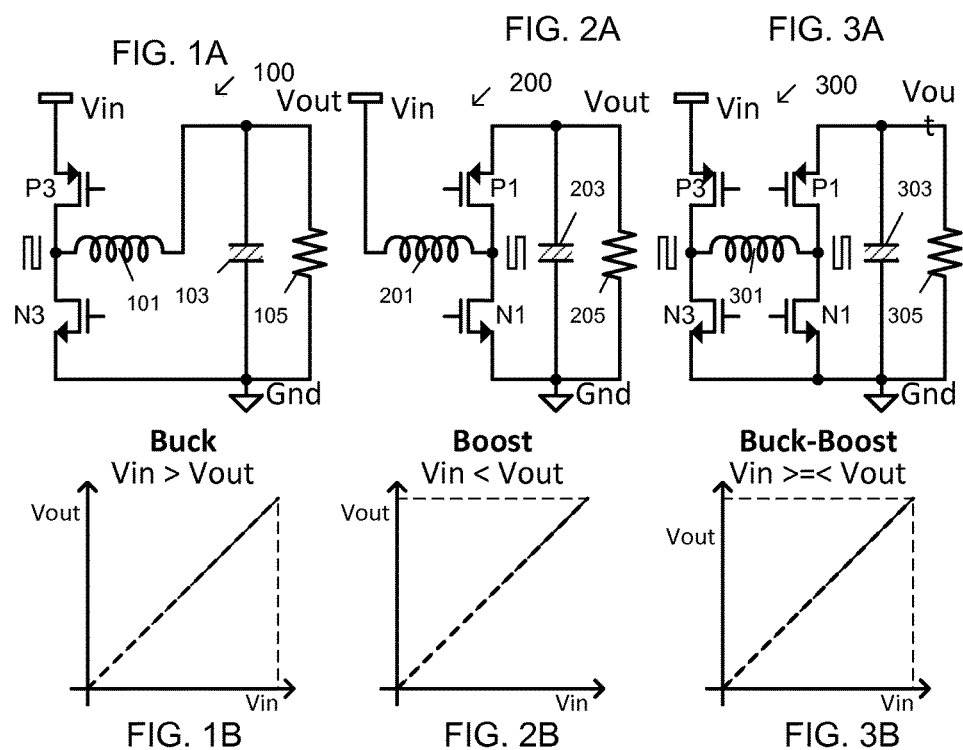

Class – A or B or AB
Vin >> Vout

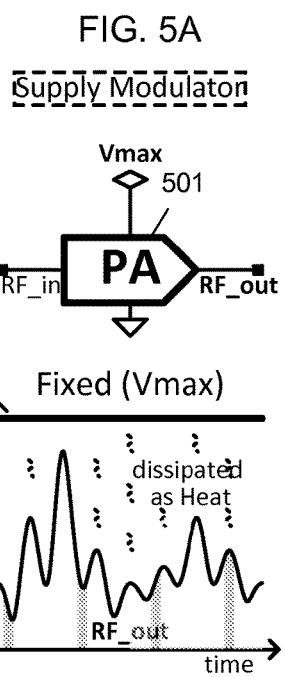
FIG. 5A
FIG. 5B
Fixed (Vmax)
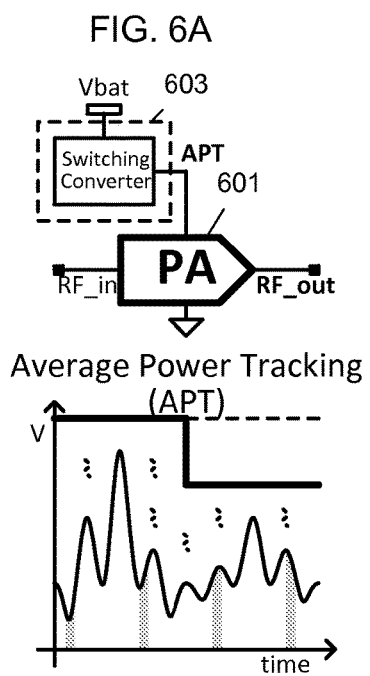
FIG. 6A
FIG. 6B
Average Power Tracking (APT)
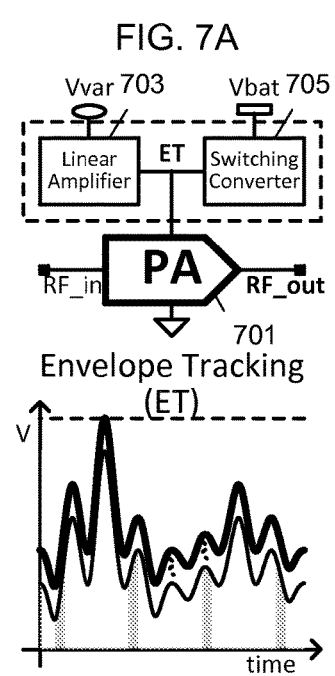
FIG. 7A
FIG. 7B
Envelope Tracking (ET)

APPARATUS FOR AND METHOD OF A SUPPLY MODULATOR FOR A POWER AMPLIFIER

PRIORITY

This application claims priority under 35 U.S.C. §119(e) to a U.S. Provisional Patent Application filed on Sep. 18, 2015 in the United States Patent and Trademark Office and assigned Ser. No. 62/220,463, and a U.S. Provisional Patent Application filed on Oct. 16, 2015 in the United States Patent and Trademark Office and assigned Ser. No. 62/242,939, the entire contents of each of which are incorporated herein by reference.

BACKGROUND OF THE DISCLOSURE

Field of the Disclosure

The present disclosure relates generally to an apparatus for and a method of a supply modulator (SM) for a power amplifier (PA), and more particularly, to an apparatus for and a method of an SM for a PA that supports an average power tracking (APT) mode with a high voltage and to an SM for a PA that is efficient and has optimal performance in an envelope tracking (ET) mode.

Description of the Related Art

A switched mode power supply (SMPS) provides a regulated direct current (DC) supply that can deliver more power for a given size, cost, and weight of a power unit.

FIG. 1A is a schematic diagram of a buck converter 100 used in an SMPS circuit where a DC output voltage Vout must be lower than a DC input voltage Vin.

Referring to FIG. 1A, the buck converter 100 includes a third p-channel metal oxide semiconductor (PMOS) transistor P3, a third n-channel MOS (NMOS) transistor N3, an inductor 101, a capacitor 103, and a load, depicted as a resistor 105.

The third PMOS transistor P3 includes a source for receiving Vin, a gate to turn the third PMOS transistor P3 on and off, and a drain connected to one end of the inductor 101 and a drain of the third NMOS transistor N3. The third NMOS transistor N3 includes a gate for turning the third NMOS transistor N3 on and off and a source connected to a ground potential. The third PMOS transistor P3 and the third NMOS transistor N3 are turned on/off and off/on, respectively.

The inductor 101 includes a second end connected to a first end of the capacitor 103 and a first end of the load resistor 105 at which Vout is generated, where second ends of the capacitor 103 and the load resistor 105 are connected to the ground potential.

FIG. 1B is a graph of Vout versus Vin for the buck converter 100, which illustrates that Vout is less than Vin.

FIG. 2A is a schematic diagram of a boost converter 200 used in an SMPS circuit where a DC output voltage Vout must be higher than a DC input voltage Vin.

Referring to FIG. 2A, the boost converter 200 includes an inductor 201, a first PMOS transistor P1, a first NMOS transistor N1, a capacitor 203, and a load, depicted as a resistor 205.

The inductor 201 includes a first end for receiving Vin and a second end connected to a drain of the first PMOS transistor P1 and a drain of the first NMOS transistor N1.

The first PMOS transistor P1 includes a source connected to a first end of the capacitor 203 and a first end of the load resistor 205 at which Vout is generated, and a gate to turn the first PMOS transistor P1 on and off. Second ends of the capacitor 203 and the load resistor 205 are connected to a ground potential. The first NMOS transistor N1 includes a gate for turning the first NMOS transistor N1 on and off and a source connected to the ground potential. The first PMOS transistor P1 and the first NMOS transistor N1 are turned on/off and off/on, respectively.

FIG. 2B is a graph of Vout versus Vin for the boost converter 200, which illustrates that Vout is greater than Vin.

FIG. 3A is a buck-boost converter 300 used in an SMPS circuit where a DC output voltage Vout must be either less that or higher than a DC input voltage Vin. The buck-boost converter 300 may operate as either a buck converter in buck mode or a boost converter in boost mode.

Referring to FIG. 3A, the buck boost converter 300 includes a first PMOS transistor P1, a first NMOS transistor N1, an inductor 301, a third PMOS transistor P3, a third NMOS transistor N3, a capacitor 303, and a load, depicted as a resistor 305.

The third PMOS transistor P3 includes a source for receiving Vin, a gate to turn the third PMOS transistor P3 on and off, and a drain connected to a first end of the inductor 301 and a drain of the third NMOS transistor N3. The third NMOS transistor N3 includes a gate for turning the third NMOS transistor N3 on and off and has a source connected to a ground potential. In buck mode, the third PMOS transistor P3 and the third NMOS transistor N3 are turned on/off and off/on, respectively, where the first PMOS transistor P1 and the first NMOS transistor N1 are off.

The inductor 301 includes a second end connected to a drain of the first PMOS transistor P1 and a drain of the first NMOS transistor N1.

The first PMOS transistor P1 includes a source connected to a first end of the capacitor 303 and a first end of the load resistor 305 at which Vout appears, and a gate to turn the first PMOS transistor P1 on and off. Second ends of the capacitor 303 and the load resistor 305 are connected to the ground potential. The first NMOS transistor N1 includes a gate for turning the first NMOS transistor N1 on and off and a source connected to the ground potential. In boost mode, the first PMOS transistor P1 and the first NMOS transistor N1 are turned on/off and off/on, respectively, where the third PMOS transistor P3 and the third NMOS transistor N3 are off.

FIG. 3B is a graph of Vout versus Vin for the boost converter 300 for both buck mode and boost mode, which illustrates that Vout can be less than, equal to, or greater than Vin.

The efficiency of each of the buck, boost, and buck-boost converters is theoretically 100%. However, losses occur due to path resistance and parasitic capacitance. While the buck, boost, and buck-boost converters have high efficiency, they may exhibit low speed.

FIG. 4A is a schematic of a linear amplifier (LA) 400. An LA is an electronic circuit whose output is proportional to its input (e.g. Vout may be much less than Vin), and is capable of delivering more power into a load. There are different classes of LA (e.g., class A, class B, class AB, etc.). A class A LA can exhibit good linearity in both single ended and push-pull topologies. Class B and class AB LAs can exhibit linearity only in the push-pull topology, in which two active elements (e.g. transistors) are used to amplify positive and negative parts of a radio frequency (RF) cycle respectively.

Referring to FIG. 4A, the LA 400 includes a first PMOS transistor P1, a first NMOS transistor N1, and a load represented by a resistor 401.

FIG. 4B is a graph of Vout versus Vin for the LA 400.

The efficiency of an LA is theoretically 0% to approximately 78.5% ($\pi/4$) due to voltage drops of the technology (e.g. complementary MOS (CMOS)) in which the LA 400 is implemented. While the LA 400 has low efficiency, it can exhibit high speed.

SUMMARY

An aspect of the present disclosure provides an apparatus for and a method of an SM for a PA that can operate in APT mode to support HV-PA.

Another aspect of the present disclosure provides an apparatus for and a method of an SM for a PA that can operate in ET mode more efficiently.

In accordance with an aspect of the present disclosure, an apparatus for and method of an SM for a PA is provided. The apparatus includes a buck-boost converter, including a supply input connected to a battery voltage (Vbat), and an output; a switch and capacitors module, including a first input connected to the output of the buck-boost converter, and a second input; a buck (dual) converter, including a supply input connected to Vbat, an input connected to the output of the buck-boost converter, and an output connected to the second input of the switch and capacitors module; an LA, including a supply input connected to the output of the buck-boost converter, an input, and an output connected to the second input of the switch and capacitors module; and the PA, including a supply input connected to the output of the buck (dual converter, an input for receiving an RF signal, and an output for outputting an RF signal.

In accordance with another aspect of the present disclosure, an apparatus for an SM for a PA is provided. The apparatus includes a buck-boost converter, including a supply input connected to a Vbat, and an output; a switch and capacitors module, including a first input connected to the output of the buck-boost converter, and a second input; a buck (dual) converter, including a supply input connected to Vbat, an input connected to the output of the buck-boost converter, and an output connected to the second input of the switch and capacitors module; an LA, including a supply input connected to the output of the buck-boost converter, an input, and an output connected to the second input of the switch and capacitors module; and the PA, including a supply input connected to the output of the buck (dual converter, an input for receiving an RF signal, and an output for outputting an RF signal.

In accordance with another aspect of the present disclosure, a method of an SM in APT mode for supporting a low voltage for a power amplifier (LV-PA) is provided. The method includes deactivating a buck-boost converter, including a supply input connected to Vbat, and an output; activating a switch and capacitors module, including a first input connected to the output of the buck-boost converter, and a second input; activating a buck (dual) converter, including a supply input connected to Vbat, an input connected to the output of the buck-boost converter, and an output connected to the second input of the switch and capacitors module, wherein the buck (dual) converter is operated in buck mode, includes an inductor that is capable of carrying a current greater than 1 ampere (1 A), and outputs an average current in the range of hundreds of mAs; deactivating an LA, including a supply input connected to the output of the buck-boost converter, an input, and an output connected to the second input of the switch and capacitors module; and activating the PA, including a supply input connected to the output of the buck (dual) converter, an input for receiving an RF signal, and an output for outputting an RF signal.

In accordance with another aspect of the present disclosure, a method of an SM in APT mode for supporting HV-PA is provided. The method includes activating a buck-boost converter, including a supply input connected to Vbat, and an output, wherein the buck-boost converter includes an inductor that is capable of carrying a current greater than 1 A, and outputs an average current in the range of hundreds of mAs; activating a switch and capacitors module, including a first input connected to the output of the buck-boost converter, and a second input; deactivating a buck (dual) converter, including a supply input connected to Vbat, an input connected to the output of the buck-boost converter, and an output connected to the second input of the switch and capacitors module; deactivating an LA, including a supply input connected to the output of the buck-boost converter, an input, and an output connected to the second input of the switch and capacitors module; and activating the PA, including a supply input connected to the second input of the switch and capacitors module, an input for receiving an RF signal, and an output for outputting an RF signal.

In accordance with another aspect of the present disclosure, a method of an SM in ET mode for supplying voltages to an LA and a PA that are necessary to track an envelope of an RF output signal of the PA is provided. The method includes activating a buck-boost converter, including a supply input connected to Vbat, and an output, wherein the buck-boost converter includes a first inductor that is capable of carrying a current greater than 1 A, and outputs an average current in the range of hundreds of mAs; activating a switch and capacitors module, including a first input connected to the output of the buck-boost converter, and a second input; activating a buck (dual) converter, including a supply input connected to Vbat, an input connected to the output of the buck-boost converter, and an output connected to the second input of the switch and capacitors module, wherein the buck (dual) converter is operated to output a voltage greater than Vbat, includes a second inductor that is capable of carrying a current greater than 1 A, and outputs an average current in the range of hundreds of mAs; activating the LA, including a supply input connected to the output of the buck-boost converter, an input, and an output connected to the second input of the switch and capacitors module; and activating the PA, including a supply input connected to the output of the buck (dual) converter, an input for receiving an RF signal, and an output for outputting the RF output signal.

In accordance with another aspect of the present disclosure, a method of an SM in APT mode for supporting LV-PA is provided. The method includes activating a first buck-boost converter, including a supply input connected to Vbat, and an output, wherein the first buck-boost converter is operated in buck mode, includes an inductor that is capable of carrying a current less than 1 A, and outputs an average current in the range of tens of mAs; activating a switch and capacitors module, including a first input connected to the output of the first buck-boost converter, and a second input; deactivating a second buck-boost converter, including a supply input connected to Vbat, and an output connected to the second input of the switch and capacitors module; deactivating an LA, including a supply input connected to the output of the first buck-boost converter, an input, and an output connected to the second input of the switch and capacitors module; and activating the PA, including a supply input connected to the second input of the switch and capacitors module, an input for receiving an RF signal, and an output for outputting an RF signal.

In accordance with another aspect of the present disclosure, a method of an SM in APT mode for supporting HV-PA is provided. The method includes deactivating a first buck-boost converter, including a supply input connected to Vbat), and an output; activating a switch and capacitors module, including a first input connected to the output of the first buck-boost converter, and a second input; activating a second buck-boost converter, including a supply input connected to Vbat, and an output connected to the second input of the switch and capacitors module, wherein the second buck-boost converter includes an inductor that is capable of carrying a current greater than 1 A), and outputs an average current in the range of hundreds of mAs; deactivating an LA, including a supply input connected to the output of the first buck-boost converter, an input, and an output connected to the second input of the switch and capacitors module; and activating the PA, including a supply input connected to the second input of the switch and capacitors module, an input for receiving an RF signal, and an output for outputting an RF signal.

In accordance with another aspect of the present disclosure, a method of an SM in ET mode for supplying voltages to an LA and a PA that are necessary to track an envelope of an RF output signal of the PA is provided. The method includes activating a first buck-boost converter, including a supply input connected to Vbat, and an output, wherein the first buck-boost converter includes a first inductor that is capable of carrying a current less than 1 A, and outputs an average current in the range of tens of mAs; activating a switch and capacitors module, including a first input connected to the output of the buck-boost converter, and a second input; activating a second buck-boost converter, including a supply input connected to Vbat, and an output connected to the second input of the switch and capacitors module, wherein the second buck-boost converter includes a second inductor that is capable of carrying a current greater than 1 A, and outputs an average current in the range of hundreds of mAs; activating the LA, including a supply input connected to the output of the buck-boost converter, an input, and an output connected to the second input of the switch and capacitors module; and activating the PA, including a supply input connected to the output of the second buck-boost converter, an input for receiving an RF signal, and an output for outputting the RF output signal.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 1A is a schematic diagram of a buck converter;
FIG. 1B is a graph of Vin versus Vout for the buck converter of FIG. 1A;
FIG. 2A is a schematic diagram of a boost converter;
FIG. 2B is a graph of Vin versus Vout for the boost converter of FIG. 2A;
FIG. 3A is a schematic diagram of a buck-boost converter;
FIG. 3B is a graph of Vin versus Vout for the buck-boost converter of FIG. 3A;
FIG. 5A is a block diagram of a PA with a fixed supply voltage;
FIG. 5B is a graph of an RF output signal versus the supply voltage;

FIG. 6A is a block diagram of a PA with a first supply voltage based on Vmax and an second supply voltage based on APT;
FIG. 6B is a graph of an RF output signal versus the first supply voltage and the second supply voltage;
FIG. 7A is a block diagram of a PA with a supply voltage waveform based on ET;
FIG. 7B is a graph of an RF output signal versus the supply voltage waveform.

DETAILED DESCRIPTION OF EMBODIMENTS OF THE PRESENT DISCLOSURE

Figure 4A:
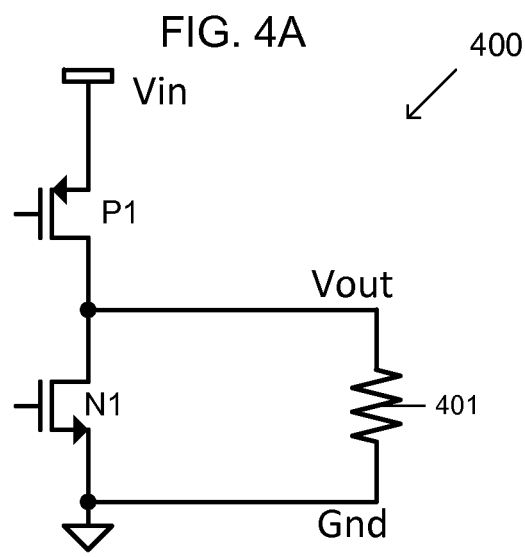
FIG. 4A is a schematic diagram of an LA.
Figure 4B:
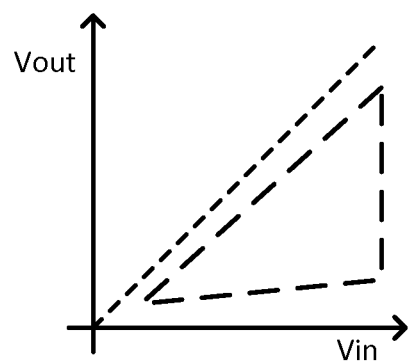
FIG. 4B is a graph of Vin versus Vout for the LA of FIG. 4A.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist the overall understanding of the embodiments of the present disclosure. Therefore, it should be apparent to those skilled in the art that various changes and modifications of the embodiments described herein may be made without departing from the scope and spirit of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the spirit and the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Such terms as those defined in a generally used dictionary are to be interpreted to have the same meanings as the contextual meanings in the relevant field of art, and are not to be interpreted to have ideal or excessively formal meanings unless clearly defined in the present disclosure.

FIG. 5A is a block diagram of a PA 501 with a fixed supply voltage (e.g. Vmax).

Referring to FIG. 5A, the PA 501 has a supply voltage that is fixed for all RF input signals RF_in provided to an input of the PA 501. For each RF_in signal, the PA 105 outputs an RF signal RF_out.

FIG. 5B is a graph of an RF_out signal versus the supply voltage (e.g. Vmax). The supply voltage remains constant and is independent of the RF_out signal. Since a difference between the supply voltage level and the voltage level of the RF_out signal is dissipated as heat in the PA 501 instead of being used for operational purposes, the PA 501 with a fixed supply voltage is inefficient due to the power loss.

FIG. 6A is a block diagram of a PA 601 with a first supply voltage based on Vmax and an second supply voltage based on average power tracking (APT).

Referring to FIG. 6A, the PA 601 is provided a first supply voltage when an RF_out signal is above a first predetermined voltage level and is provided a second supply voltage when an RF_out signal is below a second predetermined voltage level, where the second supply voltage is lower than the first supply voltage, and where the first predetermined voltage level and the second predetermined voltage level may be the same or different. For example, the second supply voltage may be determined as a function of tracking the average power of the PA 601 and adjusting the supply voltage according to the average power. This is referred to as average power tracking (APT).

To provide two different supply voltages under the two conditions described above, the PA 601 includes a switching converter 603, where the supply voltage to the switching converter 603 is Vbat. During APT mode a high voltage is supplied as the first supply voltage when the RF_out signal is above the first predetermined voltage level, and a low voltage is supplied as the second supply voltage when the RF_out signal is below the second predetermined voltage level.

FIG. 6B is a graph of an RF_out signal versus the first supply voltage and the second supply voltage. The supply voltage is high when the RF_out signal is above the first predetermined voltage level, but is reduced when the RF_out signal is below the second predetermined voltage level. Since the supply voltage is lowered in APT mode when the RF_out signal is below the second predetermined voltage level, the PA 601 exhibits lower power loss than does the PA 501 of FIG. 5A described above and, thus, is more efficient than the PA 501.

FIG. 7A is a block diagram of a PA 701 with a supply voltage waveform based on envelope tracking (ET). That is, the supply voltage is modulated to track an envelope of the RF_out signal. This is commonly referred to as envelope tracking (ET).

Referring to FIG. 7A, the PA 701 is provided a supply voltage that tracks the RF_out signal.

To provide a supply voltage that tracks the RF_out signal, the PA 701 includes an LA with a variable supply voltage and a switching converter 705 with a supply voltage of Vbat. During ET mode a supply voltage waveform that tracks the RF_out signal is supplied to the PA 701.

FIG. 7B is a graph of an RF_out versus the supply voltage waveform. Since the supply voltage of the PA 701 tracks the RF_out signal, the PA 701 exhibits lower power loss than the PA 501 of FIG. 5A described above and the PA 601 of FIG. 6A described above, and, thus, is more efficient than the PA 501 and the PA 601.

Figures 8, 9:
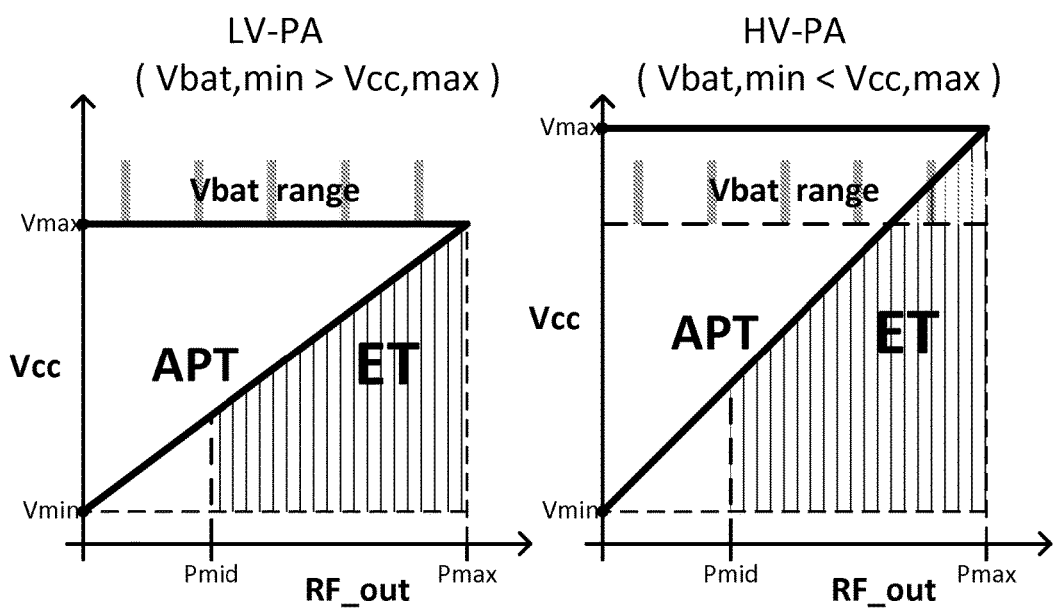
FIG. 8 is a graph of an RF output signal versus Vcc for a low voltage PA in APT and ET.
FIG. 9 is a graph of an RF output signal versus Vcc for a high voltage PA in APT and ET.

FIG. 8 is a graph of an RF_out signal versus the supply voltage of a PA (e.g. Vcc) for a low voltage (i.e., Vmin to Vmax, where Vmax is less than the minimum Vbat (e.g. Vbat,min). This is referred to as low voltage PA (LV-PA) mode. LV-PA may be used in APT mode (e.g. low voltage APT) and in ET mode (e.g. low voltage ET).

FIG. 9 is a graph of an RF_out signal versus the supply voltage of a PA (e.g. Vcc) for a high voltage (i.e., Vmin to Vmax, where Vmax is greater than Vbat,min. This is referred to as high voltage PA (HV-PA) mode. HV-PA may be used in APT mode (e.g. high voltage APT) and in ET mode (e.g. high voltage ET).

The present disclosure concerns an apparatus for and a method of an SM for a PA that supports the APT mode in not only LV-PA but also in HV-PA. In addition, the present disclosure provides an apparatus for and a method of an SM for a PA that supports the ET mode more efficiently (i.e., with less power loss) than the SM for a PA in FIG. 10, described below, in ET mode.

Figure 10:
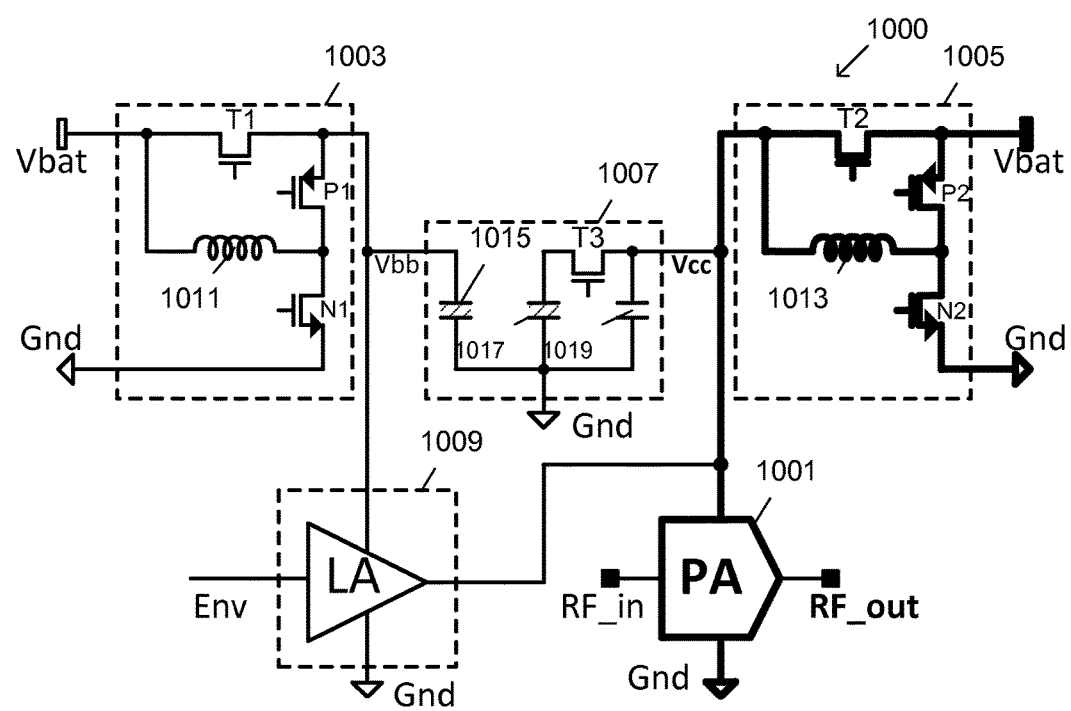
FIG. 10 is a block diagram of an SM for a PA.

FIG. 10 is a block diagram of an SM 1000 for a PA 1001.

Referring to FIG. 10, the SM 1000 is connected to the PA 1001 and includes a boost converter 1003, a buck converter 1005, a switch and capacitors module 1007, and an LA 1009, where a line that is bolded indicates that it carries a higher current than a line that is not bolded.

The boost converter 1003 includes a first inductor 1011, a first PMOS transistor P1, a first NMOS transistor N1, and a first transistor T1. FIG. 10 shows the first PMOS transistor P1 and the first NMOS transistor N1. However, a transistor of an embodiment of the present disclosure is not limited to any particular transistor type, but may include any suitable transistor type (e.g. an NMOS transistor, a PMOS transistor, or an NMOS transistor and a PMOS transistor connected as a complementary MOS (CMOS) switch).

The first inductor 1011 has a first end connected to a battery voltage (Vbat) and, for example, a first terminal of the first transistor T1 (e.g. a pass transistor for passing current that is not found in a boost converter of the related art), and a second end connected to, for example, drains of the first PMOS transistor P1 and the first NMOS transistor N1. The first transistor T1 may be an NMOS transistor, a PMOS transistor, or an NMOS transistor and a PMOS transistor connected as a CMOS switch. The first inductor 1011 has an inductance value in a predetermined range (e.g. 1 µH to 10 µH) and a current carrying capability that is less than 1 Ampere (e.g. less than 1 A). The first inductor 1011 is referred to as a "small inductor," because of its physical size, which is approximately 2 millimeters (2 mm) in length and 1.6 mm in width. However, as technology develops and the size of such an inductor changes, another size may be used in an embodiment of the present disclosure. A boost converter having the first inductor 1011 in this inductance range and a current carrying capability that is less than 1 A is commonly referred to as a "small boost converter."

A source of the first NMOS transistor N1 is connected to ground, and a first terminal of the first transistor T1 is connected to the source of the first PMOS transistor P1, where the first terminal of the first transistor T1 and the source of the first PMOS transistor P1 is the output of the boost converter 1003. Not shown, but known by a person skilled in the art, is a control signal for turning on and turning off any transistor of an embodiment of the present disclosure (e.g. the first transistor T1, the first PMOS transistor P1, and the first NMOS transistor N1 to cause the boost converter 1003 to operate as a boost converter).

In operation, the boost converter 1003 outputs a voltage Vbb that is greater than or equal to Vbat and, depending on transistor sizes, an average output current in the range of tens of mAs.

The buck converter 1005 includes the second inductor 1013, a second transistor T2, a second PMOS transistor P2, and a second NMOS transistor N2. The second transistor T2 may be an NMOS transistor, a PMOS transistor, or an NMOS transistor and a PMOS transistor connected as a CMOS switch. The second PMOS transistor P2 is shown as a PMOS transistor and the second NMOS transistor N2 is shown as an NMOS transistor. However, the present disclosure is not limited to any particular transistor type, but may include any suitable transistor type.

The second inductor 1013 has a first end connected to, for example, drains of the second PMOS transistor P2 and the second NMOS transistor N2, and a second end connected to, for example, a first terminal of the second transistor T2, where the second end of the second inductor 1013 and the first terminal of the second transistor T2 are the output of the buck converter 1005. A source of the second NMOS transistor N2 is connected to ground, and a second terminal of the second transistor T2 and the source of the second PMOS transistor P2 are connected to Vbat. The second inductor 1013 has an inductance value in a predetermined range (e.g. 1 µH to 10 µH) and a current carrying capability that is greater than 1 A. The second inductor 1013 is referred to as a "large inductor," because of its physical size, which is approximately 2 millimeters (2 mm) in length and 2 mm in width. However, as technology develops and the size of such an inductor changes, another size may be used in an embodiment of the present disclosure. A buck converter 1005 having an inductor 1013 in this inductance range and a current carrying capability that is greater than 1 A is commonly referred to as a "large buck converter."

In operation, the buck converter 1005 outputs a voltage Vcc that is less than or equal to Vbat and, depending on transistor sizes, an average output current in the range of hundreds of mAs.

The switch and capacitors module 1007 includes a third transistor T3, a first capacitor 1015, a second capacitor 1017, and a third capacitor 1019. The third transistor T3 may be an NMOS transistor, a PMOS transistor, or an NMOS transistor and a PMOS transistor connected as a CMOS switch.

The first capacitor 1015 is connected between the output of the small boost converter 1003 and ground. The first capacitor 1015 has a capacitance value in the range of 1 microfarad (µF) to 10 µFs. The second capacitor 1017 is connected between a first terminal of the third transistor T3 and ground. The second capacitor 1017 has a capacitance value in the range of 1 µF to 10 µFs. The third capacitor 1019 is connected between the output of the large buck converter 1005 and ground. The third capacitor 1019 has a capacitance value in the range of 0.1 nanofarad (nF) to 10 nFs. According to one embodiment, the switch and capacitors module 1007 includes discrete capacitors that are not integrated with the other components of the SM 1000 together on a semiconductor integrated circuit (IC) or chip. In another embodiment, the switch and capacitors module 1007 is integrated with the other components of the SM 1000 as part of a semiconductor IC or chip.

Figure 11:
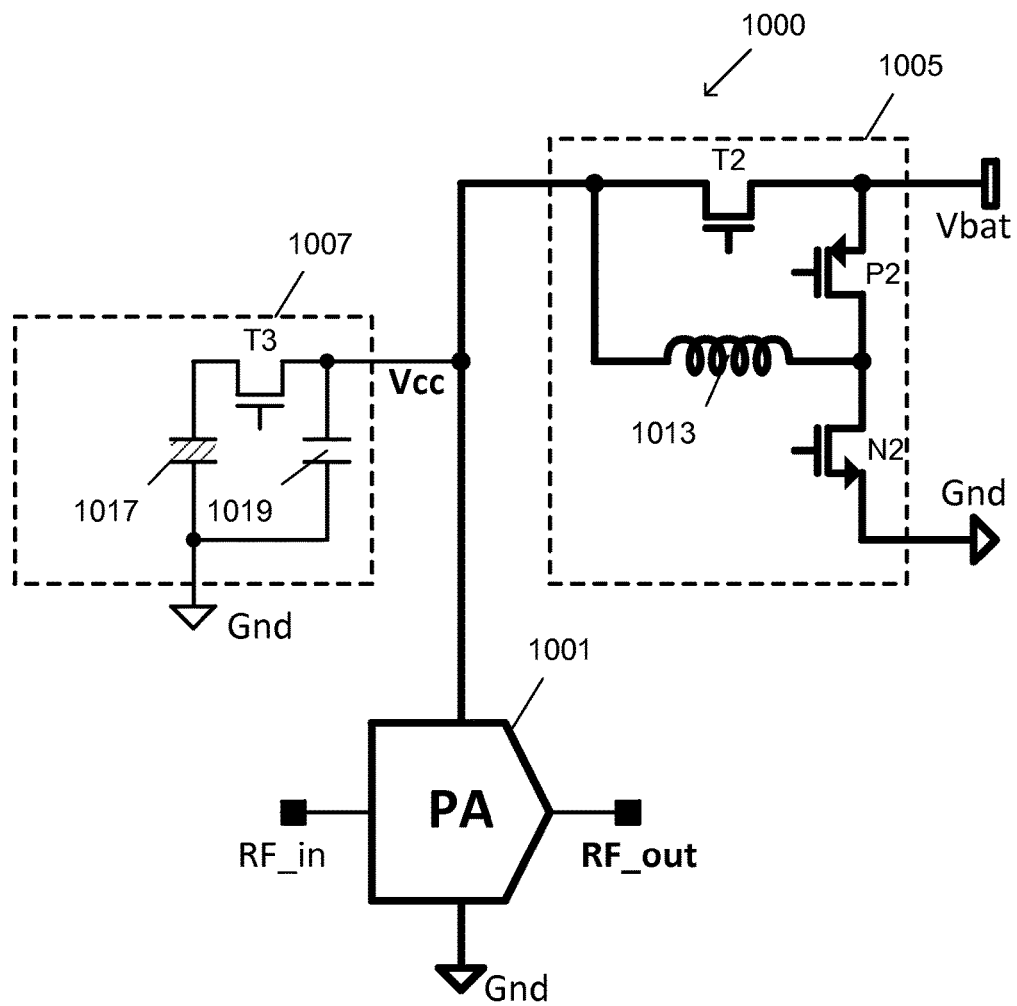
FIG. 11 is a block of the SM of the PA of FIG. 10 in APT mode to support LV-PA.

The second capacitor 1017 and the third capacitor 1019 are used in parallel in the APT mode of operation of the SM 1000 of FIG. 10 that supports LV-PA, as illustrated in FIG. 11 described below, where the components that are deactivated by a control signal are not shown. The SM 1000 of FIG. 10 does not support HV-PA in APT mode, because the buck converter 1005 cannot output a voltage greater than Vbat.

Figure 12:
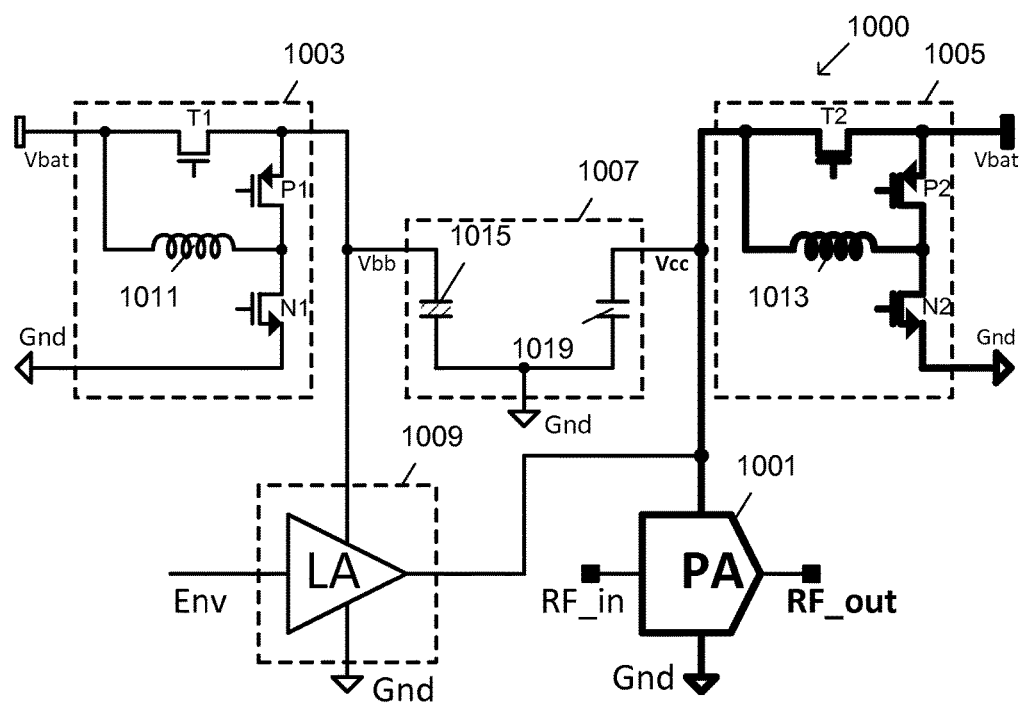
FIG. 12 is a block of the SM of the PA of FIG. 10 in ET mode to support LV-PA.

The first capacitor 1015 and the third capacitor 1019 are used separately in the ET mode of operation of the SM 1000 of FIG. 10, as illustrated in FIG. 12 described below, where the components that are deactivated by a control signal are not shown.

The LA 1009 includes a supply voltage input connected to the output of the small boost converter 1003, a ground input connected to ground, an input for receiving a signal that will be traced in ET mode to determine an envelope for the signal, and an output.

The PA 1001 has a supply voltage input connected to the output of the large buck converter 1005 and the output of the LA 1009, a ground input connected to ground, an input for receiving an RF input signal RF_in, and an output for outputting an RF signal RF_out.

FIG. 11 is a block diagram of the SM 1000 of the PA 1001 of FIG. 10, described above, in APT mode to support LV-PA.

Since the SM 1000 includes a large buck converter 1005, it can only output a voltage (Vcc) that is less than Vbat. Thus, in APT mode, the SM 1000 can only support LV-PA and cannot support HV-PA.

Referring to FIG. 11, the SM 1000 is controlled to activate the PA 1001, the large buck converter 1005, and the switch and capacitors module 1007, and to deactivate the small boost converter 1003, the first capacitor 1015, and the LA 1009.

The third transistor T3 of the switch and capacitors module 1007 is turned on so that the effective capacitance of the switch and capacitors module 1007 is the sum of the capacitances of the second capacitor 1017 and the third capacitor 1019.

Since the large buck converter 1005 outputs a voltage less than Vbat, the SM 1000 operating in APT mode can only support LV-PA and cannot support HV-PA.

FIG. 12 is a block diagram of the SM 1000 of the PA of FIG. 10, described above, in ET mode to support LV-PA.

Referring to FIG. 12, the SM 1000 is controlled to activate the PA 1001, the small boost converter 1003, the switch and capacitors module 1007, and the LA 1009.

The third transistor T3 of the switch and capacitors module 1007 is turned off so that the first capacitor 1015 and the third capacitor 1019 operate separately, and the second capacitor 1015 is not used.

In operation, the small boost converter 1003 outputs a voltage greater than Vbat, and the large buck converter 1005 outputs a voltage less than Vbat. Thus, the SM 1000 supporting ET mode can supply voltages to the LA 1009 that are necessary to track the envelope of the RF_out signal of the PA 1001. Since the small boost converter 1003 outputs a voltage greater than Vbat and the large buck converter 1005 outputs a voltage less than Vbat, the SM 1000 exhibits poor efficiency due to power loss.

There is a need for an SM for a PA that can operate in APT mode and support HV-PA. There is also a need for an SM for a PA that can operate in ET mode more efficiently than the SM 1000 of FIG. 10 described above.

Figure 13:
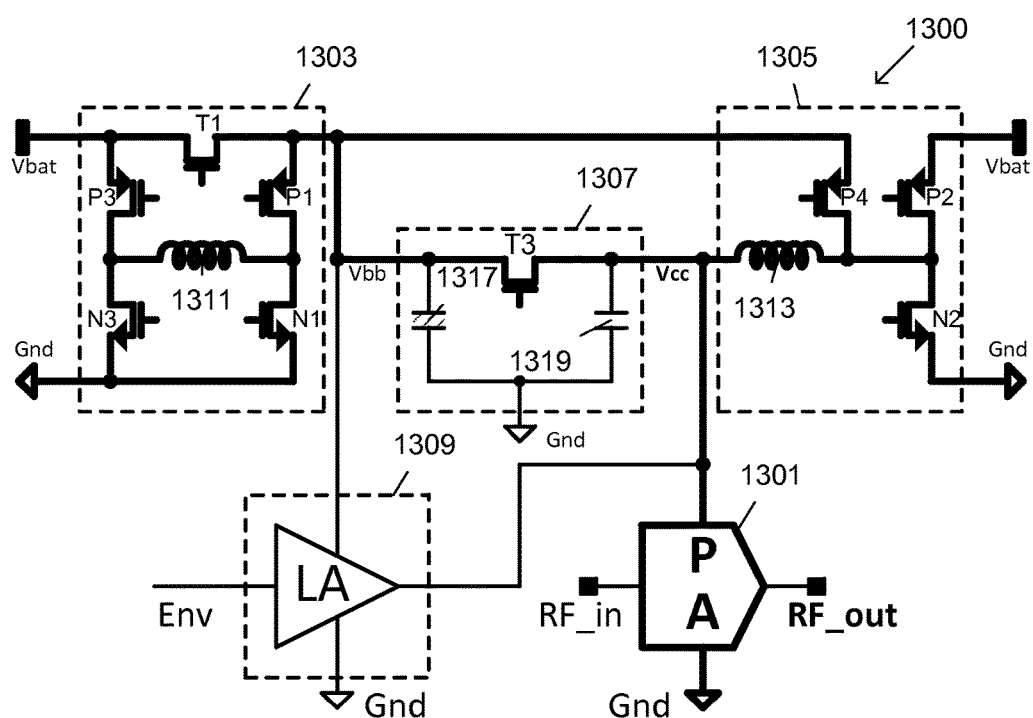
FIG. 13 is a block of an SM of a PA according to an embodiment of the present disclosure.

FIG. 13 is a block diagram of an SM 1300 of a PA 1301 according to an embodiment of the present disclosure.

Referring to FIG. 13, the SM 1300 is connected to the PA 1301 and includes a buck-boost converter 1303, a buck (dual) converter 1305, a switch and capacitors module 1307, and a linear amplifier (LA) 1309, where a line that is bolded indicates that it carries a greater current than a line that is not bolded.

The buck-boost converter 1303 includes a first inductor 1311, a first transistor T1 (e.g. a pass transistor for passing current), a first PMOS transistor P1, a first NMOS transistor N1, a third PMOS transistor P3, and a third NMOS transistor N3. The first transistor T1 may be an NMOS transistor, a PMOS transistor, or an NMOS transistor and a PMOS transistor connected as a CMOS switch. FIG. 13 shows the first PMOS transistor P1 and the third PMOS transistor P3 as PMOS transistors and the first NMOS transistor N1 and the third NMOS transistor N3 as NMOS transistors. However, a transistor of an embodiment of the present disclosure is not limited to any particular transistor type, but may include any suitable transistor type (e.g. an NMOS transistor, a PMOS transistor, or an NMOS transistor and a PMOS transistor connected as a CMOS switch).

The first inductor 1311 has an inductance value in a predetermined range (e.g. 1 μH to 10 μH) and a current carrying capability that is greater than 1 A. The first inductor 1311 is referred to as a "large inductor," because of its physical size, which is approximately 2 mm in length and 2 mm in width. However, as technology develops and the size of such an inductor changes, another size may be used in an embodiment of the present disclosure. A buck-boost converter 1303 having an inductor 1311 in this inductance range and a current carrying capability that is greater than 1 A is commonly referred to as a "large buck-boost converter."

The first inductor 1311 has a first end connected to, for example, drains of the first PMOS transistor P1 and the first NMOS transistor N1 and a second end connected to, for example, drains of the third PMOS transistor P3 and the third NMOS transistor N3. Sources of the first NMOS transistor N1 and the third NMOS transistor N3 are connected to ground. A first terminal of the first transistor T1 and the source of the third PMOS transistor P3 are connected to a battery voltage (Vbat). A second terminal of the first transistor T1 is connected to the source of the first PMOS transistor 1315, where the second terminal of the first transistor T1 and the source of the first PMOS transistor P1 are the output of the large buck-boost converter 1303.

In operation, the buck-boost converter 1303 is controlled to output a voltage Vbb that is either less than Vbat, when operated in buck mode, or greater than Vbat, when operated in boost mode. Depending on transistor sizes, an average output current in the range of hundreds of mAs is produced. To support HV-PA in APT mode, the buck-boost converter 1303 outputs a voltage greater than Vbat. In ET mode, the buck-boost converter 1303 outputs a voltage that is greater than Vbat for both the LA 1309 and the source of the fourth PMOS transistor P4 of the large buck (dual) converter 1305. Thus, the large buck dual converter 1305 can output a voltage greater than Vbat.

The buck (dual) converter 1305 includes a second inductor 1313, a second PMOS transistor P2, a fourth PMOS transistor P4, and a second NMOS transistor N2. FIG. 13 shows the second PMOS transistor P2 and the fourth PMOS transistor P4 as PMOS transistors and the second NMOS transistor N2 as an NMOS transistor. However, a transistor of an embodiment of the present disclosure is not limited to any particular transistor type, but may include any suitable transistor type (e.g. an NMOS transistor, a PMOS transistor, or an NMOS transistor and a PMOS transistor connected as a CMOS switch).

The second inductor 1313, has an inductance value in a predetermined range (e.g. 1 μH to 10 μH) and a current carrying capability that is greater than 1 A. The second inductor 1313 is referred to as a "large inductor," because of its physical size, which is approximately 2 mm in length and 2 mm in width. However, as technology develops and the size of such an inductor 1313 changes, another size may be used in an embodiment of the present disclosure. A buck (dual) converter 1305 having an inductor 1313 in this inductance range and a current carrying capability greater that is than 1 A is referred to as a "large buck (dual) converter." The second inductor 1313 has a first end connected to, for example, drains of the second PMOS transistor P2, the fourth PMOS transistor P4, and the second NMOS transistor N2, and a second end that is the output of the buck (dual) converter 1305. A source of the fourth PMOS transistor P4 is connected to the output of the buck-boost converter 1303. The source of the second PMOS transistor P2 is connected to Vbat, and the source of the second NMOS transistor N2 is connected to ground.

In operation, the buck (dual) converter 1305 outputs a voltage Vcc that is less than Vbat in APT mode to support LV-PA and an output voltage that is either less than or greater than Vbat in ET mode that are necessary to track the envelope of the RF_out signal of the PA 1301. Depending on transistor sizes, the buck (dual) converter 1305 outputs an average current in the range of hundreds of mAs (hereinafter referred to as a "large buck (dual) converter"). Since the large buck-boost converter 1303 outputs a voltage greater than Vbat and the large buck (dual) converter 1305 outputs a voltage greater than Vbat via the fourth PMOS transistor P4 connected to the large buck-boost converter 1303, the SM 1300 exhibits improved efficiency due to less power loss as compared to the SM 1000 of FIG. 10 described above.

The switch and capacitors module 1307 includes a third transistor T3, a first capacitor 1317, and a second capacitor 1319. The third transistor T3 may be any suitable transistor type (e.g. an NMOS transistor, a PMOS transistor, an NMOS transistor and a PMOS transistor connected as a CMOS switch, etc.).

In an embodiment of the present disclosure, the switch and capacitors module 1307 may be configured as the switch and capacitors module 1007 of FIG. 10 described above.

The first capacitor 1317 is connected between the output of the large buck-boost converter 1303 and ground. The first capacitor 1317 has a capacitance value in the range of 1 µF to 10 µFs. The second capacitor 1319 is connected between the output of the large buck (dual) converter 1305 and ground. The second capacitor 1319 has a capacitance value in the range of 0.1 nF to 10 nFs. According to one embodiment, the switch and capacitors module 1307 includes discrete capacitors that are not integrated with the other components of the SM 1300 together on a semiconductor IC or chip. In another embodiment, the switch and capacitors module 1307 is integrated with the other components of the SM 1300 as part of a semiconductor IC or chip.

Figure 14:
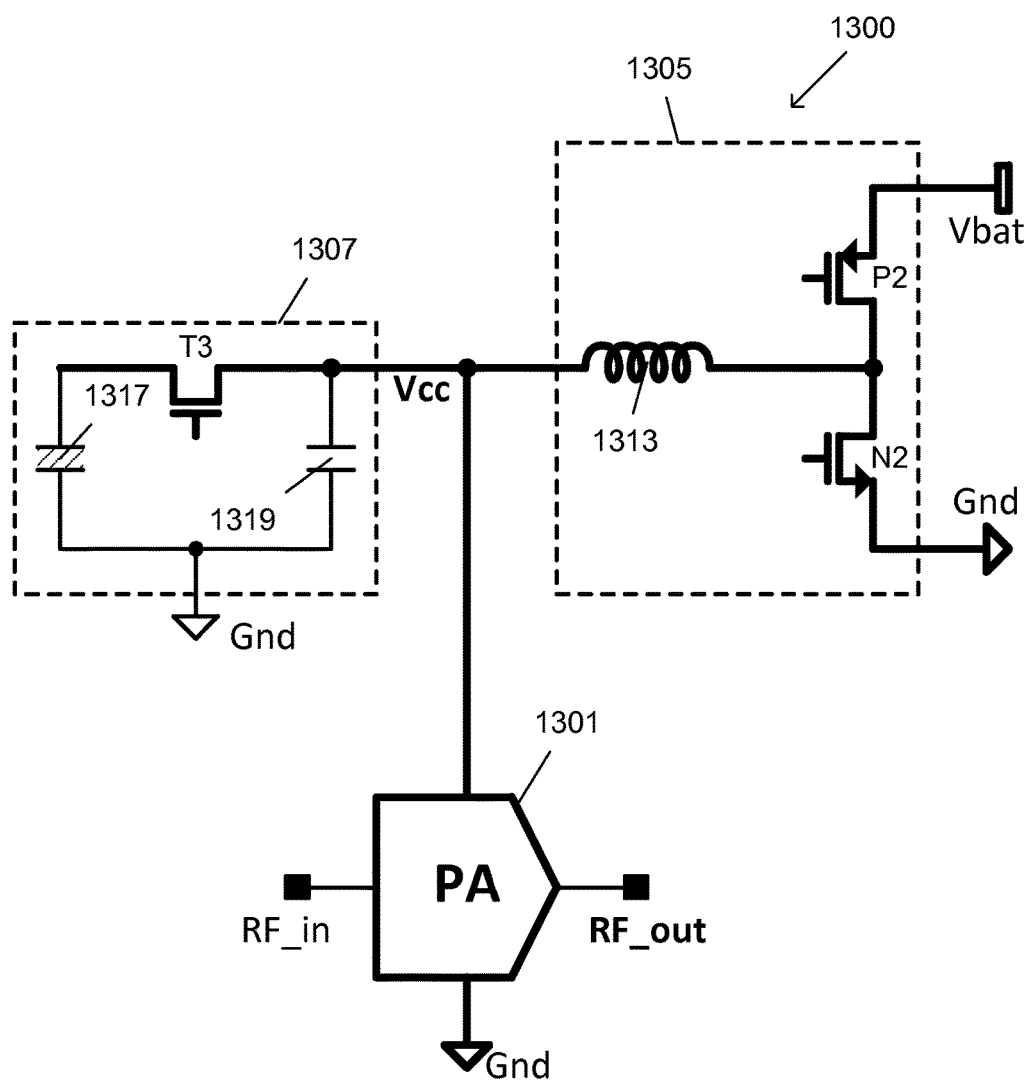
FIG. 14 is a block of the SM of the PA of FIG. 13 in APT mode to support LV-PA according to an embodiment of the present disclosure.
Figure 15:
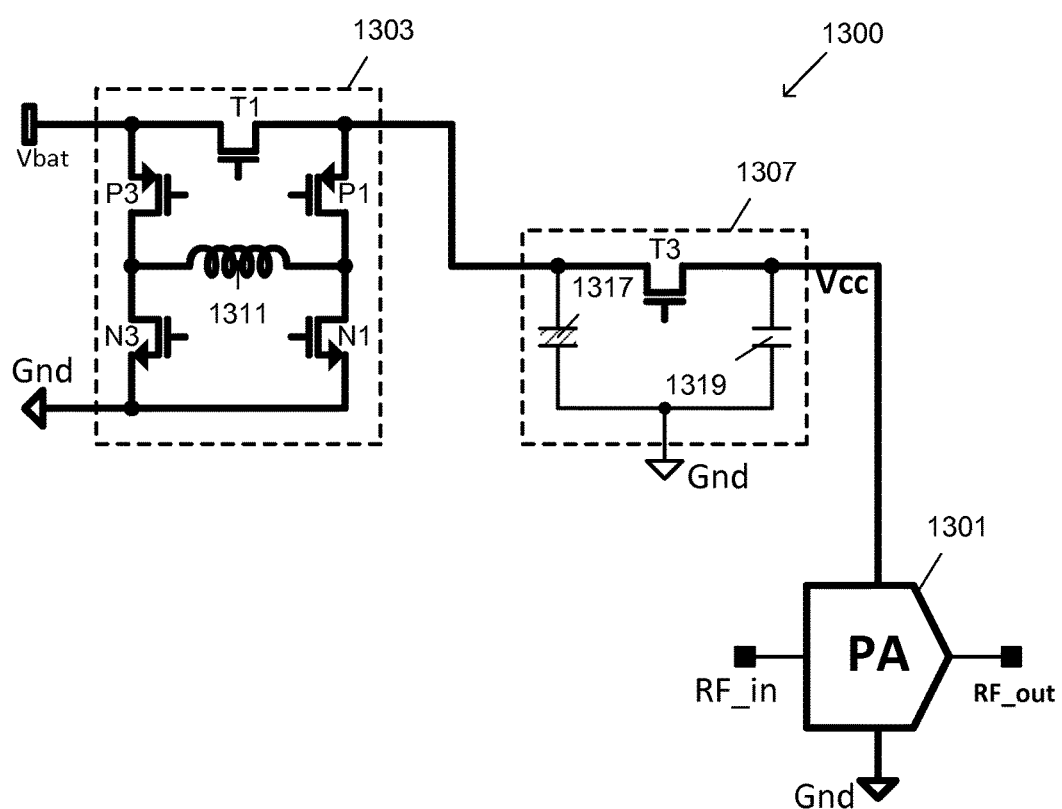
FIG. 15 is a block of the SM of the PA of FIG. 13 in APT mode to support HV-PA according to an embodiment of the present disclosure.

The first capacitor 1317 and the second capacitor 1319 of the switch and capacitors module 1307 are used in parallel, for the SM 1300 to support LV-PA and HV-PA in APT mode, as illustrated in FIGS. 14 and 15 described below, respectively. The first capacitor 1317 and the second capacitor 1319 are coupled by turning on the third transistor T3.

Figure 16:
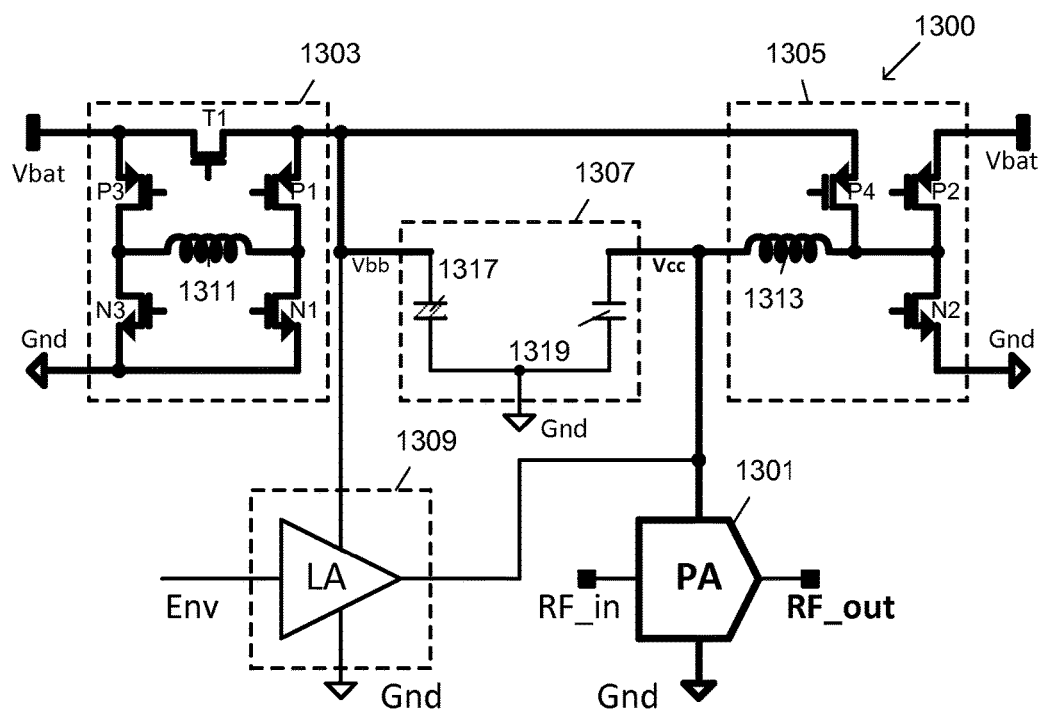
FIG. 16 is a block of the SM of the PA of FIG. 13 in ET mode to support HV-PA according to an embodiment of the present disclosure.

In ET mode as illustrated in FIG. 16 described below, the first capacitor 1317 and the second capacitor 1319 are used separately by turning off the third transistor T3.

The LA 1309 includes a supply voltage input connected to the output of the large buck-boost converter 1303, a ground input connected to ground, an input for receiving an input signal, and an output.

The PA 1301 includes a supply voltage input connected to the output of the large buck (dual) converter 1305 and the output of the LA 1309, a ground input connected to ground, an input for receiving an RF signal RF_in, and an output for outputting an RF signal RF_out.

FIG. 14 is a block diagram of the SM 1300 of the PA 1301 of FIG. 13, described above, in APT mode to support LV-PA according to an embodiment of the present disclosure.

Referring to FIG. 14, the SM 1300 is controlled to activate the PA 1301, the large buck (dual) converter 1305, and the switch and capacitors module 1307, and to deactivate the large buck-boost converter 1303 and the LA 1309.

In operation, the fourth PMOS transistor P4, which connects to the deactivated large buck-boost converter 1303, is turned off so that the large buck (dual) converter 1305 functions as a buck converter. The third transistor T3 of the switch and capacitors module 1307 is turned on so that the switch and capacitors module 1307 has an effective capacitance equal to the sum of the capacitance values of the first capacitor 1317 and the second capacitor 1319. Thus, the large buck (dual) converter 1305 outputs a voltage Vcc that is less than Vbat. Depending on transistor sizes, the buck (dual) converter 1305 outputs an average current in the range of hundreds of mAs. Since the large buck (dual) converter 1305 outputs a voltage less than Vbat, the SM 1300 in APT mode supports LV-PA.

FIG. 15 is a block diagram of the SM 1300 of the PA 1301 of FIG. 13, described above, in APT mode to support HV-PA according to an embodiment of the present disclosure.

Referring to FIG. 15, the SM 1300 is controlled to activate the PA 1301, the large buck-boost converter 1303, and the switch and capacitors module 1307, and to deactivate the large buck (dual) converter 1305 and the LA 1309.

In operation, the third transistor T3 of the switch and capacitors module 1307 is turned on so that the switch and capacitors module 1307 has an effective capacitance equal to the sum of the capacitance values of the first capacitor 1317 and the second capacitor 1319. Thus, the large buck-boost converter 1303 outputs a voltage Vcc that is greater than Vbat. Depending on transistor sizes, the large buck-boost buck converter 1303 outputs an average current in the range of hundreds of mAs. Since the large buck-boost converter 1303 can output a voltage greater than Vbat, the SM 1300 in APT mode supports HV-PA.

FIG. 16 is a block diagram of the SM 1300 of the PA 1301 of FIG. 13, described above, in ET mode to support HV-PA according to an embodiment of the present disclosure.

Referring to FIG. 16, the SM 1300 is controlled to activate the PA 1301, the large buck-boost converter 1303, the large buck dual converter 1305, the switch and capacitors module 1307, and the LA 1309.

In operation, the fourth PMOS transistor P4 of the large buck (dual) converter 1305 is turned on to connect to the large buck-boost converter 1303 so that the large buck (dual) converter 1305 can output a voltage greater than Vbat. The third transistor T3 of the switch and capacitors module 1307 is turned off so that the first capacitor 1317 and the second capacitor 1319 operate separately. Thus, the large buck-boost converter 1303 can output a voltage Vbb that is greater than Vbat, and the large buck (dual) converter 1305 can output a voltage Vcc that is greater than Vbat. Depending on transistor sizes, the large buck-boost converter 1303 and the buck (dual) converter 1305 each output an average current in the range of hundreds of mAs. The large bust-boost converter 1303 and the large buck (dual) converter 1305 can each output a voltage greater than Vbat. Thus, the SM 1300 supporting ET mode can supply voltages to the LA 1309 that are necessary to track the envelope of the RF_out signal of the PA 1301. Since, the large bust-boost converter 1303 and the large buck (dual) converter 1305 can each output a voltage greater than Vbat, the SM 1300 in ET mode is more efficient than the SM 1000 in FIG. 12 described above, due to exhibiting a smaller power loss.

Figure 17:
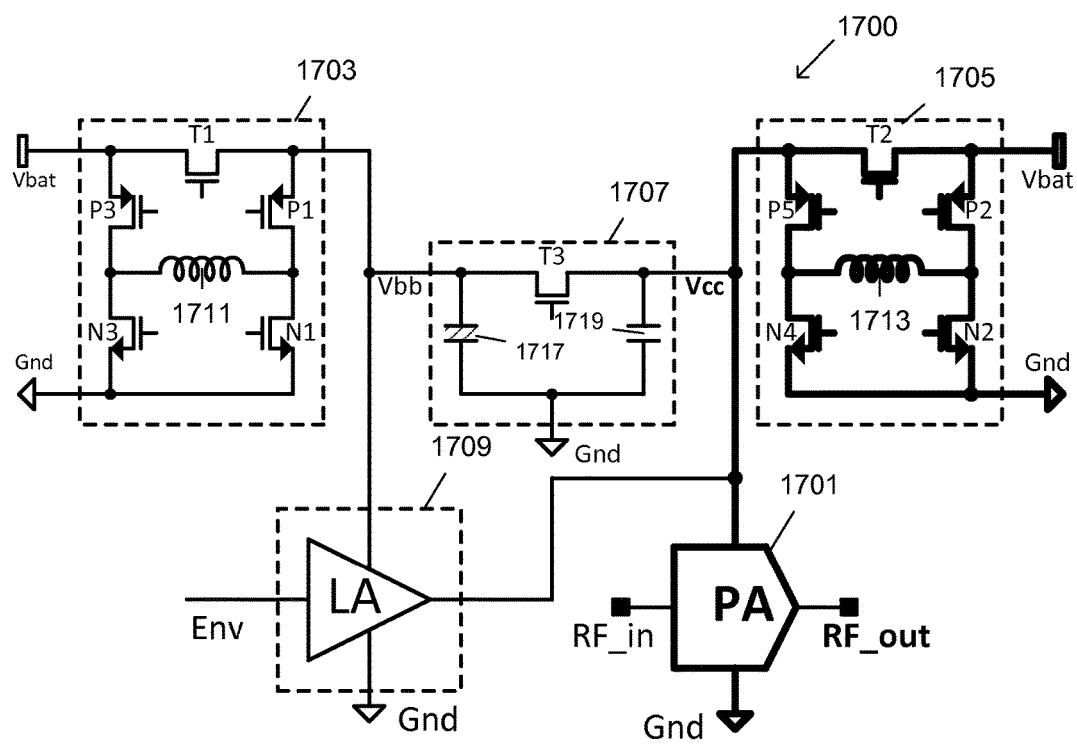
FIG. 17 is a block diagram of an SM of a PA according to an embodiment of the present disclosure.

FIG. 17 is a block diagram of an SM 1700 of a PA 1701 according to an embodiment of the present disclosure.

referring to FIG. 17, the SM 1700 is connected to the PA 1701 and includes a small buck-boost converter 1703, a large buck-boost converter 1705, a switch and capacitors module 1707, and an LA 1709, where a line that is bolded indicates that it carries a greater current than a line that is not bolded.

The small buck-boost converter 1703 includes a first inductor 1711, a first transistor T1 (e.g. a pass transistor for passing current), a first PMOS transistor P1, a first NMOS transistor N1, a third PMOS transistor P3, and a third NMOS transistor N3. FIG. 17 shows the first PMOS transistor P1 and the third PMOS transistor P3 as PMOS transistors and the first NMOS transistor N1 and the third NMOS transistor N3 as NMOS transistors. However, a transistor of an embodiment of the present disclosure is not limited to any particular transistor type, but may include any suitable transistor type (e.g. an NMOS transistor, a PMOS transistor, or an NMOS transistor and a PMOS transistor connected as a CMOS switch).

The first inductor 1711 has an inductance value in a predetermined range (e.g. 1 pH to 10 µH) and a current carrying capability that is less than 1 A. The first inductor 1711 is referred to as a "small inductor," because of its physical size, which is approximately 2 mm in length and 1.6 mm in width. However, as technology develops and the size of such an inductor changes, another size may be used in an embodiment of the present disclosure. A buck-boost converter 1703 having an inductor 1711 in this inductance range and a current carrying capability that is less than 1 A is commonly referred to as a "small buck-boost converter."

The first inductor 1711 has a first end connected to, for example, drains of the first PMOS transistor P1 and the first NMOS transistor N1 and a second end connected to, for example, drains of the third transistor P3 and the third NMOS transistor N3. Sources of the first NMOS transistor N1 and the third NMOS transistor N3 are connected to ground. A first terminal of the first transistor T1 and the source of the third PMOS transistor P3 are connected to a battery voltage (Vbat). A second terminal of the first transistor T1 is connected to the source of the first PMOS transistor P1, where the second terminal of the first transistor T1 and the source of the first PMOS transistor P1 are the output of the small buck-boost converter 1703.

In operation, the small buck-boost converter 1703 is controlled to output a voltage Vbb that is either less than Vbat, when operated in buck mode, or greater than Vbat, when operated in boost mode. Depending on transistor sizes, an average output current in the range of tens of mAs is produced. To support HV-PA in APT mode and ET mode, the small buck-boost converter 1703 outputs a voltage Vbb that is greater than Vbat.

The large buck-boost converter 1705 includes a second inductor 1713, a second transistor T2 (e.g. a pass transistor for passing current), a second PMOS transistor P2, a second NMOS transistor N2, a fifth PMOS transistor P5, and a fourth NMOS transistor N4. FIG. 17 shows the second PMOS transistor P2 and the fifth PMOS transistor P5 as PMOS transistors and the second NMOS transistor N2 and the fourth NMOS transistor N4 as NMOS transistors. However, a transistor of an embodiment of the present disclosure is not limited to any particular transistor type, but may include any suitable transistor type (e.g. an NMOS transistor, a PMOS transistor, or an NMOS transistor and a PMOS transistor connected as a CMOS switch).

The second inductor 1713 has an inductance value in a predetermined range (e.g. 1 µH to 10 µH) and a current carrying capability that is greater than 1 A. The second inductor 1713 is referred to as a "large inductor," because of its physical size, which is approximately 2 mm in length and 2 mm in width. However, as technology develops and the size of such an inductor changes, other sizes may be used in an embodiment of the present disclosure. A buck-boost converter having an inductor in this inductance range and a current carrying capability that is greater than 1 A is commonly referred to as a "large buck-boost" converter.

The second inductor 1713 has a first end connected to, for example, drains of the second PMOS transistor P2 and the second NMOS transistor N2 and a second end connected to, for example, drains of the fifth PMOS transistor P5 and the fourth NMOS transistor N4. Sources of the second NMOS transistor N2 and the fourth NMOS transistor N4 are connected to ground. A first terminal of the second transistor T2 and a source of the second PMOS transistor P2 are connected to a battery voltage (Vbat). A second terminal of the second transistor T2 is connected to the source of the fifth PMOS transistor P5, where the second terminal of the second transistor T2 and the source of the fifth PMOS transistor P5 are the output of the large buck-boost converter 1705.

In operation, the large buck-boost converter 1705 is controlled to output a voltage Vcc that is either less than Vbat, when operated in buck mode, or greater than Vbat, when operated in boost mode. Depending on transistor sizes, an average output current in the range of hundreds of mAs is produced. To support HV-PA in APT mode and ET mode, the large buck-boost converter 1705 outputs a voltage Vcc that is greater than Vbat.

The switch and capacitors module 1707 includes a third transistor T3, a first capacitor 1717, and a second capacitor 1719. The third transistor T3 may be any suitable transistor type (e.g. an NMOS transistor, a PMOS transistor, an NMOS transistor and a PMOS transistor connected as a CMOS switch, etc.).

In an embodiment of the present disclosure, the switch and capacitors module 1707 may be configured as the switch and capacitors module 1007 of FIG. 10 described above.

The first capacitor 1717 is connected between the output of the small buck-boost converter 1703 and ground. The first capacitor 1717 has a capacitance value in the range of 1 µF to 10 µFs. The second capacitor 1719 is connected between the output of the large buck-boost converter 1705 and ground. The second capacitor 1719 has a capacitance value in the range of 0.1 nF to 10 nFs. According to one embodiment, the switch and capacitors module 1707 that are not integrated with the other components of the SM 1700 together on a semiconductor IC or chip. In another embodiment, the switch and capacitors module 1707 is integrated with the other components of the SM 1700 as part of a semiconductor IC or chip.

Figure 18:
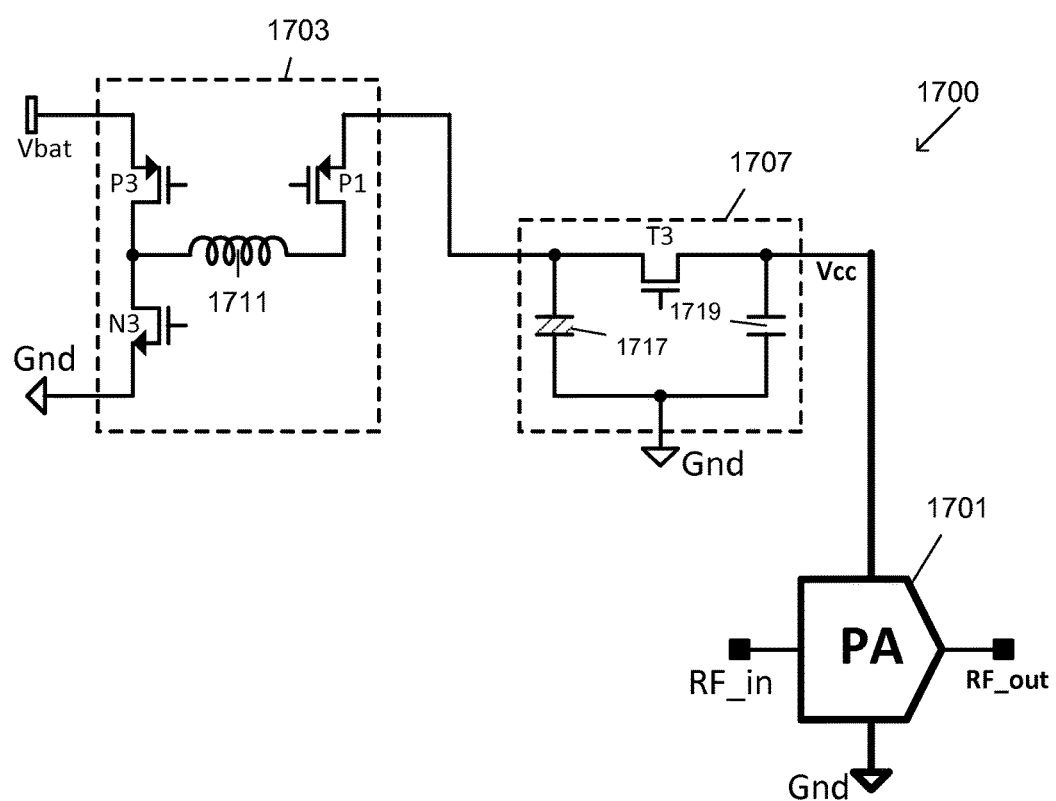
FIG. 18 is a block of the SM of the PA of FIG. 17 in APT mode to support LV-PA according to an embodiment of the present disclosure.
Figure 19:
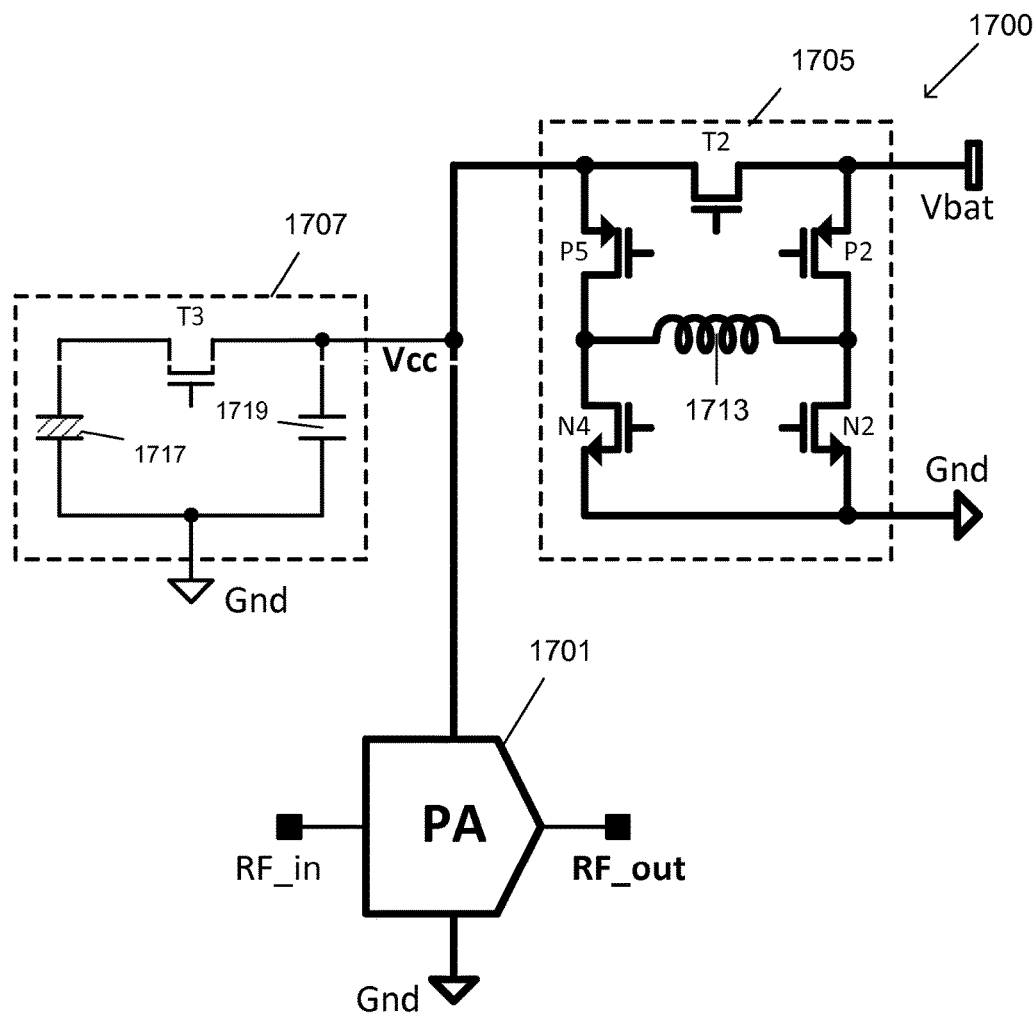
FIG. 19 is a block of the SM of the PA of FIG. 17 in APT mode to support HV-PA according to an embodiment of the present disclosure.

The first capacitor 1717 and the second capacitor 1719 of the switch and capacitors module 1707 are used in parallel, for the SM 1700 to support LV-PA and HV-PA in APT mode, as illustrated in FIGS. 18 and 19 described below, respectively. The first capacitor 1717 and the second capacitor 1719 are coupled by turning on the third transistor T3.

Figure 20:
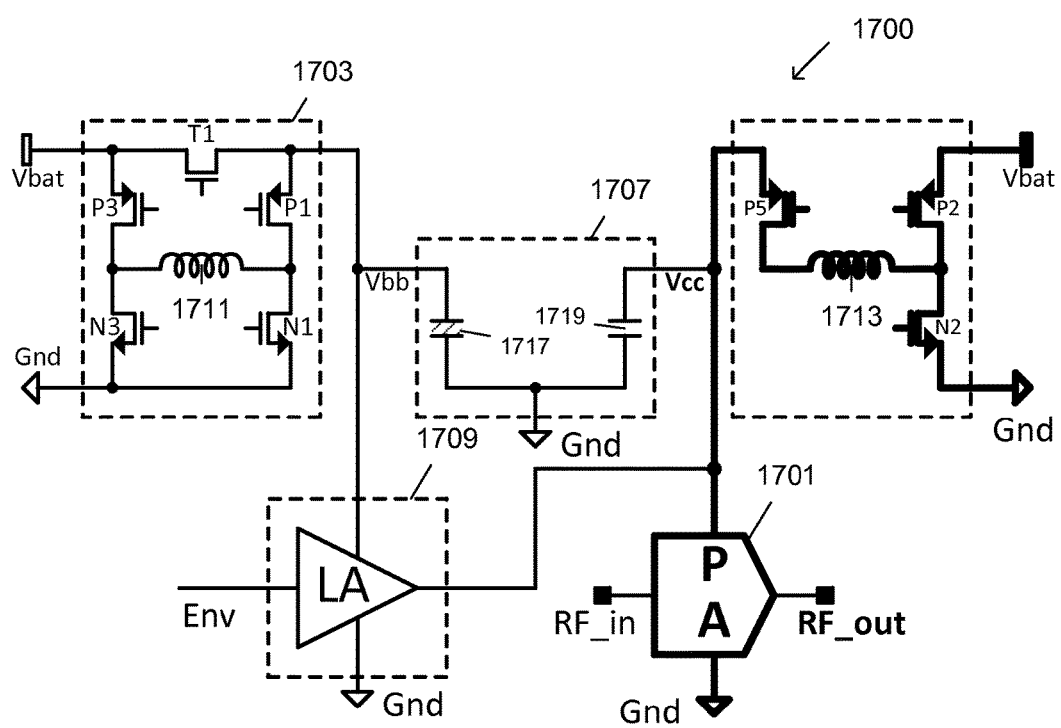
FIG. 20 is a block of the SM of the PA of FIG. 17 in ET mode to support LV-PA according to an embodiment of the present disclosure.

In ET mode as illustrated in FIG. 20 described below, the first capacitor 1717 and the second capacitor 1719 are used separately by turning off the third transistor T3.

The LA 1709 includes a supply voltage input connected to the output of the small buck-boost converter 1703, a ground input connected to ground, an input for receiving an input signal, and an output.

The PA 1701 includes a supply voltage input connected to the output of the large buck-boost converter 1705 and the output of the LA 1709, a ground input connected to ground, an input for receiving an RF signal RF_in, and an output for outputting an RF signal RF_out.

FIG. 18 is a block diagram of the SM 1700 of the PA 1701 of FIG. 17 described above in APT mode to support LV-PA according to an embodiment of the present disclosure.

Referring to FIG. 18, the SM 1700 is controlled to activate the PA 1701, the small buck-boost converter 1703 and the switch and capacitors module 1707, and to deactivate the large buck-boost converter 1705 and the LA 1709.

In operation, the first transistor T1 and the first NMOS transistor N1 of the small buck-boost converter 1703 are turned off so that the small buck-boost converter 1703 functions as a buck converter (i.e., buck mode). In buck mode, the small buck-boost converter 1703 outputs a voltage Vbb that is less than Vbat. The third transistor T3 of the switch and capacitors module 1707 is turned on so that the switch and capacitors module 1707 has an effective capacitance equal to the sum of the capacitance values of the first capacitor 1717 and the second capacitor 1719. Depending on transistor sizes, the small buck-boost converter 1703 outputs an average current in the range of tens of mAs. Since the small buck-boost converter 1703 outputs a voltage less than Vbat, the SM 1700 in APT mode supports LV-PA.

FIG. 19 is a block diagram of the SM 1700 of the PA 1701 of FIG. 17 described above in APT mode to support HV-PA according to an embodiment of the present disclosure.

Referring to FIG. 19, the SM 1700 is controlled to activate the PA 1701, the large buck-boost converter 1705, and the switch and capacitors module 1707, and to deactivate the small buck-boost converter 1703 and the LA 1709.

In operation, the third transistor T3 of the switch and capacitors module 1707 is turned on so that the switch and capacitors module 1707 has an effective capacitance equal to the sum of the capacitance values of the first capacitor 1717 and the second capacitor 1719. Thus, the large buck-boost converter 1705 outputs a voltage Vcc that is greater than Vbat. Depending on transistor sizes, the large buck-boost buck converter 1705 outputs an average current in the range of hundreds of mAs. Since the large buck-boost converter 1705 can output a voltage greater than Vbat, the SM 1700 in APT mode supports HV-PA.

FIG. 20 is a block diagram of the SM of the PA 1701 of FIG. 17, described above, in ET mode to support HV-PA according to an embodiment of the present disclosure.

Referring to FIG. 20, the SM 1700 is controlled to activate the PA 1701, the small buck-boost converter 1703, the large buck-boost converter 1705, the switch and capacitors module 1707, and the LA 1709.

In operation, the second transistor T2 and the fourth NMOS transistor N4 of the large buck-boost converter 1705 are turned off so that the large buck-boost converter 1705 operates as a buck converter (i.e., buck mode). That is, the large buck-boost converter 1705 in buck mode outputs a voltage Vcc that is less than Vbat. The third transistor T3 of the switch and capacitors module 1707 is turned off so that the first capacitor 1717 and the second capacitor 1719 operate separately. In buck mode, the small buck-boost converter 1703 outputs a voltage Vbb that is less than Vbat. In boost mode (i.e., the first transistor T1 and the third NMOS transistor N3 are off so that the small-buck-boost converter 1703 functions as a boost converter), the small buck-boost converter 1703 outputs a voltage Vbb that is greater than Vbat. Depending on transistor sizes, the small buck-boost converter 1703 outputs an average current in the range of tens of mAs, and the large buck-boost converter 1705 outputs an average current in the range of hundreds of mAs. Thus, the SM 1700 supporting ET mode can supply voltages to the LA 1709 and the PA 1701 that are necessary to track the envelope of the RF_out signal of the PA 1701. Since, the SM 1700 includes a small buck-boost 1703 and a large buck-boost 1705, the SM 1700 can be more efficient than the SM 1000 of FIG. 10 described above, due to smaller power loss.

Figure 21:
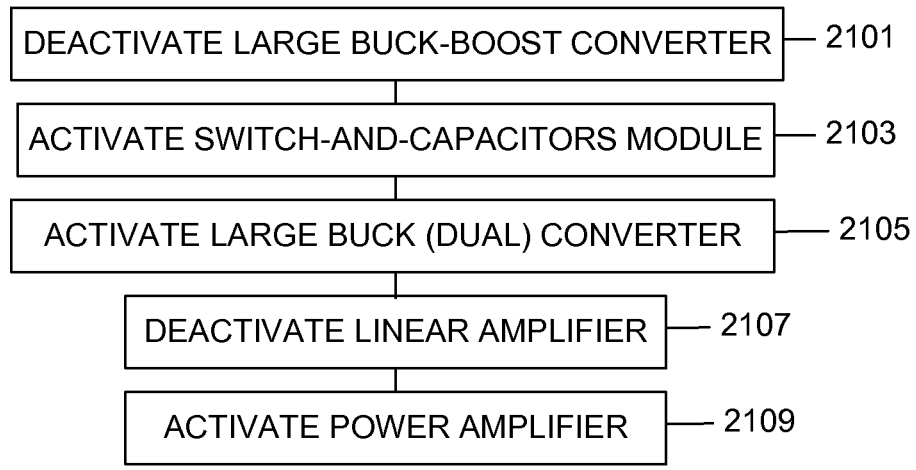
FIG. 21 is a flowchart of a method of an SM in APT mode to support LV-PA according to an embodiment of the present disclosure.

FIG. 21 is a flowchart of a method of an SM in APT mode to support LV-PA according to an embodiment of the present disclosure.

Referring to FIG. 21, and to the SM 1300 of FIG. 13 described above, a large buck-boost converter (e.g. the large buck-boost converter 1303 of FIG. 13) is deactivated in step 2101.

In step 2103, a switch and capacitors module (e.g. the switch and capacitors module 1307 of FIG. 13) is activated to operate as one capacitor.

In step 2105, a large buck (dual) converter (e.g. the large buck (dual) converter 1305 of FIG. 13) is activated to operate as a large buck converter (i.e., buck mode), where the output of the large buck (dual) converter is connected to the switch and capacitors module.

In step 2107, an LA (e.g. the LA 1309 of FIG. 13) is deactivated.

In step 2109, a PA (e.g. the PA 1301 of FIG. 13) is activated to be supplied with an output voltage of the large buck (dual) converter to operate as an LV-PA in APT mode.

Figure 22:
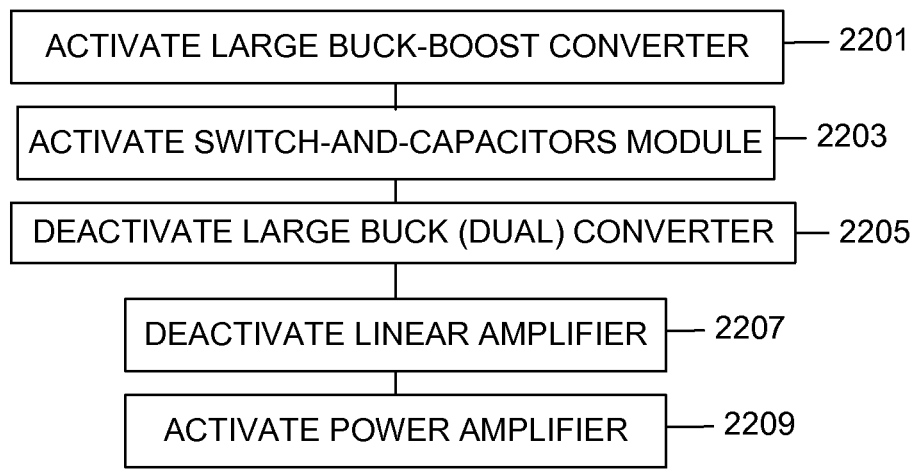
FIG. 22 is a flowchart of a method of an SM in APT mode to support HV-PA according to an embodiment of the present disclosure.

FIG. 22 is a flowchart of a method of an SM in APT mode to support HV-PA according to an embodiment of the present disclosure.

Referring to FIG. 22, and to the SM 1300 of FIG. 13 described above, a large buck-boost converter (e.g. the large buck-boost converter 1303 of FIG. 13) is activated in step 2201.

In step 2203, a switch and capacitors module (e.g. the switch and capacitors module 1307 of FIG. 13) is activated to operate as one capacitor connected to the output of the large buck-boost converter.

In step 2205, a large buck (dual) converter (e.g. the large buck (dual) converter 1305 of FIG. 13) is deactivated.

In step 2207, an LA (e.g. the LA 1309 of FIG. 13) is deactivated.

In step 2209, a PA (e.g. the PA 1301 of FIG. 13) is activated to be supplied with an output voltage of the large buck-boost converter to operate as an HV-PA in APT mode.

Figure 23:
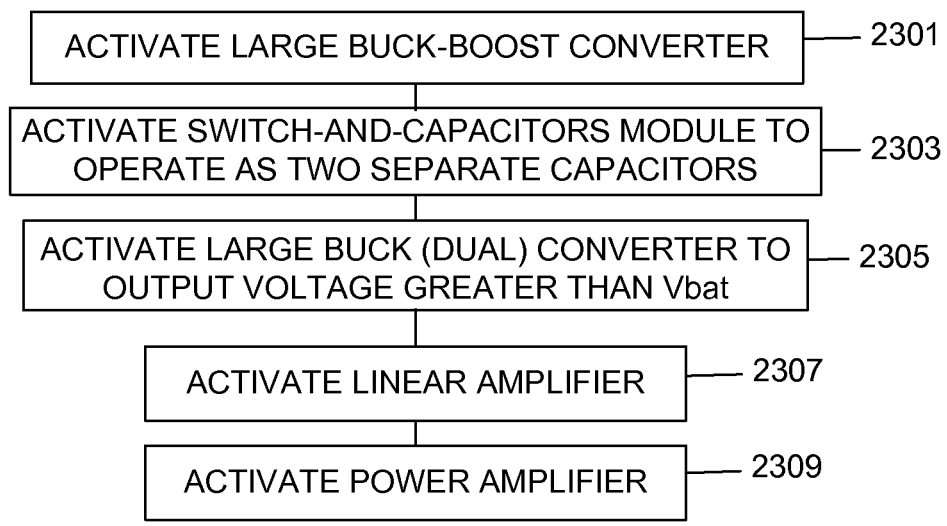
FIG. 23 is a flowchart of a method of an SM in ET mode to support HV-PA according to an embodiment of the present disclosure.

FIG. 23 is a flowchart of a method of an SM in ET mode according to an embodiment of the present disclosure.

Referring to FIG. 23, and to the SM 1300 of FIG. 13 described above, a large buck-boost converter (e.g. the large buck-boost converter 1303 of FIG. 13) is activated in step 2301.

In step 2303, a switch and capacitors module (e.g. the switch and capacitors module 1307 of FIG. 13) is activated to operate as two separate capacitors, where a first capacitor is connected to the output of the large buck-boost converter, and where there is a second capacitor that has a smaller capacitance value than the first capacitor.

In step 2305, a large buck (dual) converter (e.g. the large buck (dual) converter 1305 of FIG. 13) is activated to be able to output a voltage greater than Vbat, and the output of the large buck (dual) converter is connected to the second capacitor.

In step 2307, an LA (e.g. the LA 1309 of FIG. 13) is activated to be supplied with an output voltage of the large buck-boost converter.

In step 2309, a PA (e.g. the PA 1301 of FIG. 13) is activated to be supplied with an output of the LA and an output of the large buck (dual) converter to track an envelope of an RF output signal RF_out of the PA.

Figure 24:
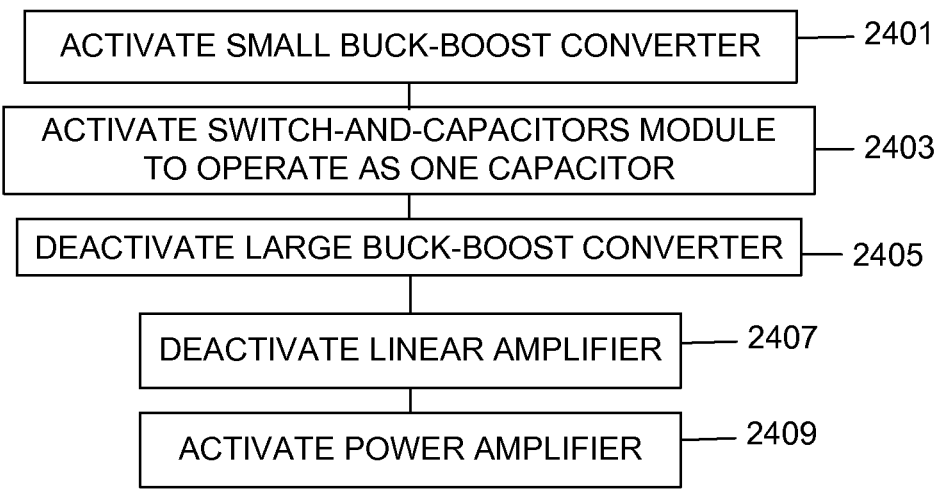
FIG. 24 is a flowchart of a method of an SM in APT mode to support LV-PA according to an embodiment of the present disclosure.

FIG. 24 is a flowchart of a method of an SM in APT mode to support LV-PA according to an embodiment of the present disclosure.

Referring to FIG. 24, and to the SM 1700 of FIG. 17 described above, a small buck-boost converter (e.g. the small buck-boost converter 1703 of FIG. 17) is activated to operate as a small buck converter (i.e., buck mode) in step 2401.

In step 2403, a switch and capacitors module (e.g. the switch and capacitors module 1707 of FIG. 17) is activated to operate as one capacitor connected to the output of the small buck-boost converter.

In step 2405, a large buck-boost converter (e.g. the large buck-boost converter 1703 of FIG. 17) is deactivated.

In step 2407, an LA (e.g. the LA 1709 of FIG. 17) is deactivated.

In step 2409, a PA (e.g. the PA 1701 of FIG. 17) is activated to be supplied with an output voltage of the small buck-boost converter to operate as an LV-PA in APT mode.

Figure 25:
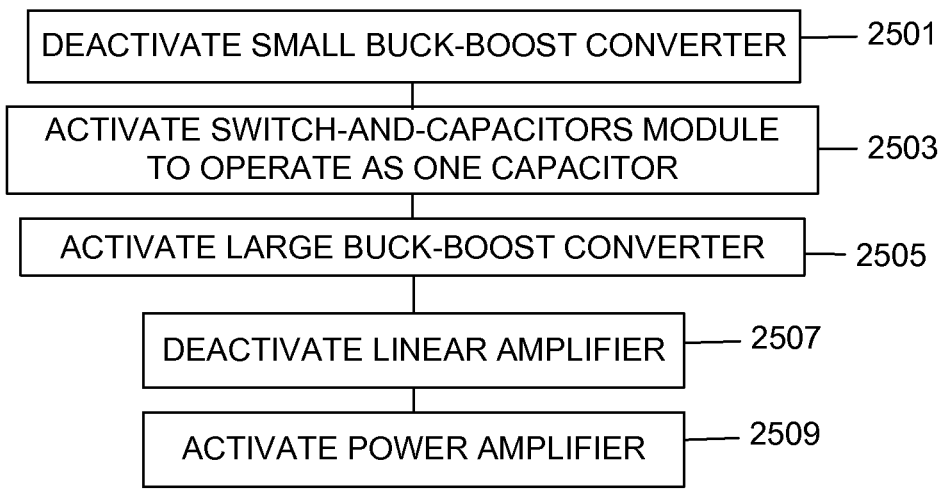
FIG. 25 is a flowchart of a method of an SM in APT mode to support HV-PA according to an embodiment of the present disclosure.

FIG. 25 is a flowchart of a method of an SM in APT mode to support HV-PA according to an embodiment of the present disclosure.

Referring to FIG. 25, and to the SM 1700 of FIG. 17 described above, a small buck-boost converter (e.g. the small buck-boost converter 1703 of FIG. 17) is deactivated in step 2501.

In step 2503, a switch and capacitors module (e.g. the switch and capacitors module 1707 of FIG. 17) is activated to operate as one capacitor.

In step 2505, a large buck-boost converter (e.g. the large buck-boost converter 1705 of FIG. 17) is activated, where its output is connected to the one effective capacitor of the switch and capacitors module.

In step 2507, an LA (e.g. the LA 1709 of FIG. 17) is deactivated.

In step 2509, a PA (e.g. the PA 1701 of FIG. 17) is activated to be supplied with an output voltage of the large buck-boost converter to operate as an HV-PA in APT mode.

Figure 26:
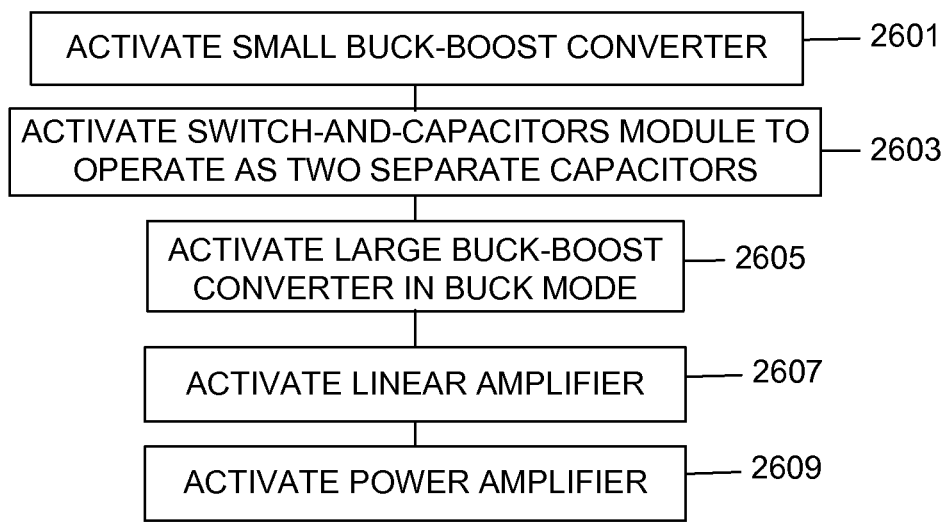
FIG. 26 is a flowchart of a method of an SM in ET mode to support LV-PA according to an embodiment of the present disclosure.

FIG. 26 is a flowchart of a method of an SM in ET mode according to an embodiment of the present disclosure.

Referring to FIG. 26, and to the SM 1700 of FIG. 17 described above, a small buck-boost converter (e.g. the small buck-boost converter 1703 of FIG. 17) is activated in step 2601.

In step 2603, a switch and capacitors module (e.g. the switch and capacitors module 1707 of FIG. 17) is activated to operate as two separate capacitors, where a first capacitor is connected to the output of the small buck-boost converter, and where there is a second capacitor that has a smaller capacitance value than the first capacitor.

In step 2605, a large buck-boost converter (e.g. the large buck-boost converter 1705 of FIG. 17) is activated to operate as a large buck converter (i.e., buck mode), where the output of the large buck-boost converter is connected to the second capacitor.

In step 2607, an LA (e.g. the LA 1709 of FIG. 17) is activated to be supplied with an output voltage of the small buck-boost converter.

In step 2609, a PA (e.g. the PA 1701 of FIG. 17) is activated to be supplied with an output of the LA and an output voltage of the large buck-boost converter to track an envelope of an RF output signal RF_out of the PA.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus for a supply modulator (SM) for a power amplifier (PA), comprising:
    a buck-boost converter, including a supply input connected to a battery voltage (Vbat), and an output;
    a switch and capacitors module, including a first input connected to the output of the buck-boost converter, and a second input;
    a buck (dual) converter, including a supply input connected to Vbat, an input connected to the output of the buck-boost converter, and an output connected to the second input of the switch and capacitors module;
    a linear amplifier (LA), including a supply input connected to the output of the buck-boost converter, an input, and an output connected to the second input of the switch and capacitors module; and
    the PA, including a supply input connected to the output of the buck (dual) converter, an input for receiving a radio frequency (RF) signal, and an output for outputting an RF signal.

2. The apparatus of claim 1, wherein the buck-boost converter comprises:
    a first transistor, including a first terminal connected to Vbat, a gate for receiving a control signal, and a second terminal connected to the output of the buck-boost converter;
    a second transistor, including a first terminal connected to the output of the buck-boost converter, a gate for receiving the control signal, and a second terminal;
    a third transistor, including a first terminal connected to the second terminal of the second transistor, a gate for receiving the control signal, and a second terminal connected to a ground;
    a fourth transistor, including a first terminal connected to Vbat, a gate for receiving the control signal, and a second terminal;
    a fifth transistor, including a first terminal connected to the second terminal of the fourth transistor, a gate for receiving the control signal, and a second terminal connected to the ground; and
    a first inductor connected between the second terminal of the second transistor and the second terminal of the fourth transistor, wherein the first inductor can carry a current greater than 1 ampere (1 A), and wherein the buck-boost converter outputs an average current in the range of hundreds of milliamperes (mAs).

3. The apparatus of claim 1, wherein the buck (dual) converter comprises:
    a sixth transistor, including a first terminal connected to the output of the buck-boost converter, a gate for receiving the control signal, and a second terminal;
    a seventh transistor, including a first terminal connected to Vbat, a gate for receiving the control signal, and a second terminal connected to the second terminal of the sixth transistor;
    an eighth transistor, including a first terminal connected to the second terminal of the sixth transistor, a gate for receiving the control signal, and a second terminal connected to a ground; and
    a second inductor connected between the second terminal of the sixth transistor and an output of the buck (dual) converter, wherein the second inductor can carry a current greater than 1 ampere (1 A), and wherein the buck (dual) converter outputs an average current in the range of hundreds of milliamperes (mAs).

4. The apparatus of claim 1, wherein the switch and capacitors module comprises:
    a ninth transistor, including a first terminal connected to the output of the buck-boost converter, a gate for receiving the control signal, and a second terminal connected to the output of the buck (dual) converter;
    a first capacitor connected between the first terminal of the ninth transistor and a ground; and
    a second capacitor connected between the second terminal of the ninth transistor and the ground.

5. The apparatus of claim 4, wherein the first capacitor has a capacitance value in the range of from 1 microfarad (µF) to 10 µF, and wherein the second capacitor has a capacitance value in the range of from 0.1 nanofarad (nF) to 10 nF.

6. The apparatus of claim 1, wherein the switch and capacitors module comprises:
   a tenth transistor, including a first terminal connected to the output of the buck (dual) converter, a gate for receiving the control signal, and a second terminal;
   a third capacitor connected between the output of the buck-boost converter and a ground;
   a fourth capacitor connected between the second terminal of the tenth transistor and the ground; and
   a fifth capacitor connected between the first terminal of the tenth transistor and the ground.

7. The apparatus of claim 2, wherein each transistor is either an n-channel metal oxide semiconductor (NMOS) transistor, a p-channel MOS (PMOS) transistor, or a PMOS transistor and an NMOS transistor connected as a complementary MOS (CMOS) switch.

8. An apparatus for a supply modulator (SM) for a power amplifier (PA), comprising:
   a first buck-boost converter, including a supply input connected to a battery voltage (Vbat), and an output;
   a switch and capacitors module, including a first input connected to the output of the first buck-boost converter, and a second input;
   a second buck-boost converter, including a supply input connected to Vbat, and an output connected to the second input of the switch and capacitors module;
   a linear amplifier (LA), including a supply input connected to the output of the first buck-boost converter, an input, and an output connected to the second input of the switch and capacitors module; and
   the PA, including a supply input connected to the output of the second buck-boost converter, an input for receiving a radio frequency (RF) signal, and an output for outputting an RF signal.

9. The apparatus of claim 8, wherein the first buck-boost converter comprises:
   a first transistor, including a first terminal connected to Vbat, a gate for receiving a control signal, and a second terminal connected to the output of the first buck-boost converter;
   a second transistor, including a first terminal connected to the output of the first buck-boost converter, a gate for receiving the control signal, and a second terminal;
   a third transistor, including a first terminal connected to the second terminal of the second transistor, a gate for receiving the control signal, and a second terminal connected to a ground;
   a fourth transistor, including a first terminal connected to Vbat, a gate for receiving the control signal, and a second terminal;
   a fifth transistor, including a first terminal connected to the second terminal of the fourth transistor, a gate for receiving the control signal, and a second terminal connected to the ground; and
   a first inductor connected between the second terminal of the second transistor and the second terminal of the fourth transistor, wherein the first inductor can carry a current less than 1 ampere (1 A), and wherein the first buck-boost converter outputs an average current in the range of tens of milliamperes (mAs).

10. The apparatus of claim 8, wherein the second buck-boost converter comprises:
    a sixth transistor, including a first terminal connected to Vbat, a gate for receiving a control signal, and a second terminal connected to the output of the second buck-boost converter;
    a seventh transistor, including a first terminal connected to Vbat, a gate for receiving the control signal, and a second terminal;
    an eighth transistor, including a first terminal connected to the second terminal of the seventh transistor, a gate for receiving the control signal, and a second terminal connected to a ground;
    a ninth transistor, including a first terminal connected to the second terminal of the sixth transistor, a gate for receiving the control signal, and a second terminal;
    a tenth transistor, including a first terminal connected to the second terminal of the ninth transistor, a gate for receiving the control signal, and a second terminal connected to the ground; and
    a second inductor connected between the second terminal of the seventh transistor and the second terminal of the ninth transistor, wherein the second inductor can carry a current greater than 1 ampere (1 A), and wherein the second buck-boost converter outputs an average current in the range of hundreds of milliamperes (mAs).

11. The apparatus of claim 8, wherein the switch and capacitors module comprises:
    a eleventh transistor, including a first terminal connected to the output of the first buck-boost converter, a gate for receiving the control signal, and a second terminal connected to the output of the second buck-boost converter;
    a first capacitor connected between the first terminal of the eleventh transistor and a ground; and
    a second capacitor connected between the second terminal of the eleventh transistor and the ground.

12. The apparatus of claim 11, wherein the first capacitor has a capacitance value in the range of from 1 microfarad (µF) to 10 µF, and wherein the second capacitor has a capacitance value in the range of from 0.1 nanofarad (nF) to 10 nF.

13. The apparatus of claim 8, wherein the switch and capacitors module comprises:
    a twelfth transistor, including a first terminal connected to the output of the second buck-boost converter, a gate for receiving the control signal, and a second terminal;
    a third capacitor connected between the output of the first buck-boost converter and a ground;
    a second capacitor connected between the second terminal of the twelfth transistor and the ground; and
    a third capacitor connected between the first terminal of the twelfth transistor and the ground.

14. The apparatus of claim 9, wherein each transistor is either an n-channel metal oxide semiconductor (NMOS) transistor, a p-channel MOS (PMOS) transistor, or a PMOS transistor and an NMOS transistor connected as a complementary MOS (CMOS) switch.

15. A method of a supply modulator (SM) for a power amplifier (PA), comprising:
    connecting a supply input of a buck-boost converter to a battery voltage (Vbat);
    connecting a switch and capacitors module to an output of the buck-boost converter;
    connecting a supply input of a buck (dual) converter to Vbat;
    connecting an input of the buck (dual) converter to the output of the buck-boost converter;

connecting an output of the buck (dual) converter to a second input of the switch and capacitors module;
connecting a supply input of a linear amplifier (LA) to the output of the buck-boost converter;
connecting an output of the LA to the second input of the switch and capacitors module; and
connecting a supply input of the PA to the output of the buck (dual) converter;
receiving a radio frequency (RF) signal at an input of the PA; and
outputting a radio frequency (RF) signal at an output of the PA.

16. The method of claim 15, further comprising:
connecting, in the buck-boost converter, a first terminal of a first transistor to Vbat;
receiving a control signal at a gate of the first transistor;
connecting a second terminal of the first transistor to the output of the buck-boost converter;
connecting, in the buck-boost converter, a first terminal of a second transistor to the output of the buck-boost converter;
receiving the control signal at a gate of the second transistor;
connecting a first terminal of a third transistor to a second terminal of the second transistor;
receiving the control signal at a gate of the third transistor;
connecting a second terminal of the third transistor to a ground;
connecting, in the buck-boost converter, a first terminal of a fourth transistor to Vbat;
receiving the control signal at a gate of the fourth transistor;
connecting, in the buck-boost converter, a first terminal of a fifth transistor to a second terminal of the fourth transistor;
receiving the control signal at a gate of the fifth transistor;
connecting a second terminal of the fifth transistor to the ground; and
connecting a first inductor between the second terminal of the second transistor and the second terminal of the fourth transistor, wherein the first inductor can carry a current greater than 1 ampere (1 A), and wherein the buck-boost converter outputs an average current in the range of hundreds of milliamperes (mAs).

17. The method of claim 15, further comprising:
connecting, in the buck (dual) converter, a first terminal of a sixth transistor to the output of the buck-boost converter;
receiving the control signal at a gate of the sixth transistor;
connecting, in the buck (dual) converter, a first terminal of a seventh transistor to Vbat;
receiving the control signal at a gate of the seventh transistor;
connecting a second terminal of the seventh transistor to a second terminal of the sixth transistor;
connecting, in the buck (dual) converter, a first terminal of an eighth transistor to the second terminal of the sixth transistor;
receiving the control signal at a gate of the eighth transistor;
connecting a second terminal of the eighth transistor to a ground; and
connecting a second inductor between the second terminal of the sixth transistor and an output of the buck (dual) converter, wherein the second inductor can carry a current greater than 1 ampere (1 A), and wherein the buck (dual) converter outputs an average current in the range of hundreds of milliamperes (mAs).

18. The method of claim 15, further comprising:
connecting, in the switch and capacitors module, a first terminal of a ninth transistor to the output of the buck-boost converter;
receiving the control signal at a gate of the ninth transistor;
connecting a second terminal of the ninth transistor to the output of the buck (dual) converter;
connecting, in the switch and capacitors module, a first capacitor between the first terminal of the ninth transistor and a ground; and
connecting, in the switch and capacitors module, a second capacitor between the second terminal of the ninth transistor and the ground.

19. The method of claim 18, wherein the first capacitor has a capacitance value in the range of from 1 microfarad (µF) to 10 µF, and wherein the second capacitor has a capacitance value in the range of from 0.1 nanofarad (nF) to 10 nF.

20. The method of claim 15, further comprising:
connecting, in the switch and capacitors module, a first terminal of a tenth transistor to the output of the buck (dual) converter;
receiving the control signal at a gate of the tenth transistor;
connecting, in the switch and capacitors module, a third capacitor between the output of the buck-boost converter and a ground;
connecting, in the switch and capacitors module, a fourth capacitor between a second terminal of the tenth transistor and the ground; and
connecting, in the switch and capacitors module, a fifth capacitor between the first terminal of the tenth transistor and the ground.

21. The method of claim 16, wherein each transistor is either an n-channel metal oxide semiconductor (NMOS) transistor, a p-channel MOS (PMOS) transistor, or a PMOS transistor and an NMOS transistor connected as a complementary MOS (CMOS) switch.

22. A method of a supply modulator (SM) for a power amplifier (PA), comprising:
connecting a supply input of a first buck-boost converter to a battery voltage (Vbat);
connecting a first input of a switch and capacitors module to an output of the first buck-boost converter;
connecting a supply input of a second buck-boost converter to Vbat;
connecting an output of the second buck-boost converter to the second input of the switch and capacitors module;
connecting a supply input of a linear amplifier (LA) to the output of the first buck-boost converter;
connecting an output of the LA to the second input of the switch and capacitors module;
connecting a supply input of the PA to the output of the second buck-boost converter;
receiving a radio frequency (RF) signal at an input of the PA; and
outputting an RF signal at an output of the PA.

23. The method of claim 22, further comprising:
connecting, in the first buck-boost converter, a first terminal of a first transistor to Vbat;
receiving a control signal at a gate of the first transistor;
connecting a second terminal of the first transistor to the output of the first buck-boost converter;

connecting, in the first buck-boost converter, a first terminal of a second transistor to the output of the first buck-boost converter;
receiving the control signal at a gate of the second transistor;
connecting, in the first buck-boost converter, a first terminal of a third transistor to a second terminal of the second transistor;
receiving the control signal at a gate of the third transistor;
connecting a second terminal of the third transistor to a ground;
connecting, in the first buck-boost converter, a first terminal of a fourth transistor to Vbat;
receiving the control signal at a gate of the fourth transistor;
connecting, in the first buck-boost converter, a first terminal of a fifth transistor to the second terminal of the fourth transistor;
receiving the control signal at a gate of the fifth transistor;
connecting a second terminal of the fifth transistor to the ground; and
connecting a first inductor connected between the second terminal of the second transistor and the second terminal of the fourth transistor, wherein the first inductor can carry a current less than 1 ampere (1 A), and wherein the first buck-boost converter outputs an average current in the range of tens of milliamperes (mAs).

24. The method of claim 22, further comprising:
connecting, in the second buck-boost converter, a first terminal of a sixth transistor to Vbat;
receiving a control signal at a gate of the sixth transistor;
connecting a second terminal of the sixth transistor to the output of the second buck-boost converter;
connecting, in the second buck-boost converter, a first terminal of a seventh transistor to Vbat;
receiving the control signal at a gate of the seventh transistor;
connecting, in the second buck-boost converter, a first terminal of an eighth transistor to a second terminal of the seventh transistor;
receiving the control signal at a gate of the eighth transistor;
connecting a second terminal of the eighth transistor to a ground;
connecting, in the second buck-boost converter, a first terminal of a ninth transistor to the second terminal of the sixth transistor;
receiving the control signal at a gate of the ninth transistor;
connecting, in the second buck-boost converter, a first terminal of a tenth transistor to a second terminal of the ninth transistor;
receiving the control signal at a gate of the tenth transistor;
connecting a second terminal of the tenth transistor to the ground; and
connecting a second inductor between the second terminal of the seventh transistor and the second terminal of the ninth transistor, wherein the second inductor can carry a current greater than 1 ampere (1 A), and wherein the second buck-boost converter outputs an average current in the range of hundreds of milliamperes (mAs).

25. The method of claim 22, further comprising:
connecting, in the switch and capacitors module, a first terminal of an eleventh transistor to the output of the first buck-boost converter;
receiving the control signal at a gate of the eleventh transistor;
connecting a second terminal of the eleventh transistor to the output of the second buck-boost converter;
connecting, in the switch and capacitors module, a first capacitor between the first terminal of the eleventh transistor and a ground; and
connecting, in the switch and capacitors module, a second capacitor between the second terminal of the eleventh transistor and the ground.

26. The method of claim 25, wherein the first capacitor has a capacitance value in the range of from 1 microfarad (µF) to 10 µF, and wherein the second capacitor has a capacitance value in the range of from 0.1 nanofarad (nF) to 10 nF.

27. The method of claim 22, further comprising:
connecting, in the switch and capacitors module, a first terminal of a twelfth transistor to the output of the second buck-boost converter;
receiving the control signal at a gate of the twelfth transistor;
connecting, in the switch and capacitors module, a first capacitor between the output of the first buck-boost converter and a ground;
connecting, in the switch and capacitors module, a second capacitor between the second terminal of the twelfth transistor and the ground; and
connecting, in the switch and capacitors module, a third capacitor between the first terminal of the twelfth transistor and the ground.

28. The method of claim 23, wherein each transistor is either an n-channel metal oxide semiconductor (NMOS) transistor, a p-channel MOS (PMOS) transistor, or a PMOS transistor and an NMOS transistor connected as a complementary MOS (CMOS) switch.

* * * * *